United States Patent
Ker et al.

(10) Patent No.: US 7,023,678 B2
(45) Date of Patent: Apr. 4, 2006

(54) ESD PROTECTION DESIGNS WITH PARALLEL LC TANK FOR GIGA-HERTZ RF INTEGRATED CIRCUITS

(75) Inventors: Ming-Dou Ker, Hsinchu (TW); Cheng-Ming Lee, Taitung (TW); Tung-Yang Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/193,773

(22) Filed: Jul. 28, 2005

(65) Prior Publication Data

US 2005/0264966 A1 Dec. 1, 2005

Related U.S. Application Data

(62) Division of application No. 10/787,678, filed on Feb. 25, 2004.

(51) Int. Cl.
*H02H 9/00* (2006.01)
(52) U.S. Cl. .......................... 361/56; 361/113
(58) Field of Classification Search .................. 361/56, 361/113
See application file for complete search history.

(56) References Cited

U.S. PATENT DOCUMENTS

| | | | |
|---|---|---|---|
| 6,597,227 B1 * | 7/2003 | Yue et al. | 327/310 |
| 6,885,534 B1 * | 4/2005 | Ker et al. | 361/113 |
| 6,911,739 B1 * | 6/2005 | Jin et al. | 257/784 |
| 2003/0183403 A1 * | 10/2003 | Kluge et al. | 174/35 R |
| 2004/0165368 A1 * | 8/2004 | Norte et al. | 361/816 |
| 2004/0217914 A1 * | 11/2004 | Yamashita et al. | 343/850 |
| 2004/0264095 A1 * | 12/2004 | Block et al. | 361/119 |
| 2005/0059358 A1 * | 3/2005 | Block et al. | 455/78 |
| 2005/0184344 A1 * | 8/2005 | Ker et al. | 257/360 |

* cited by examiner

*Primary Examiner*—Ronald Leja
(74) *Attorney, Agent, or Firm*—J.C. Patents

(57) ABSTRACT

An ESD protection circuit design incorporating a single, or a plurality of, parallel inductor and capacitor, also known as LC tank(s), to avoid power loss by parasitic capacitance in ESD circuits. The first design described incorporates a LC tank structure. The second includes two LC tank structures. These structures can be expanded to form ESD protection circuit structures stacked with n-stages LC tanks. The last design described is ESD protection circuits formed by stacking the first design. These designs can avoid power gain loss from parasitic capacitance of ESD, because the parameters of LC tank can be designed to resonant at a desired operating frequency. Each of these designs can be altered slightly to create variant designs with equal identical ESD protection capabilities.

11 Claims, 17 Drawing Sheets

US 7,023,678 B2

ESD PROTECTION DESIGNS WITH PARALLEL LC TANK FOR GIGA-HERTZ RF INTEGRATED CIRCUITS

CROSS-REFERENCE TO RELATED APPLICATION

This application is a divisional application of, and claims the priority benefit of, U.S. application Ser. No. 10/787,678 filed on Feb. 25, 2004.

BACKGROUND OF THE INVENTION

Field of Invention

This invention is related to an electrostatic discharge (ESD) protection circuitry. More particularly, the invention relates to an electrostatic discharge (ESD) protection circuitry that can be used in a radio frequency (RF) circuitry for electrostatic discharge protection.

Electrostatic discharge (ESD) is a transient process of high-energy transfer from integrated circuit (IC) outside to inside when the IC is floated. On-chip ESD protection circuits are constructed into the IC to withstand such destructive currents. The total discharge process takes about ~1 μs for a human-body-model (HBM). In addition to HBM, there is also charged-device model (CDM) and machine model (MM). Several hundred volts are transferred during such ESD stresses. Voltage transition of this magnitude will make the gate oxide of input stage breakdown and render an IC malfunction. As the thickness of gate oxide is scaled down constantly with advancements in sub-micrometer-fabrication processes, it is vital to improve the design of ESD protection circuits.

A traditional ESD protection design is a two-staged protection structure for digital IC, which is shown in FIG. 1. Between a primary stage 10 and a secondary stage 20 of an input ESD protection circuit, a resistor 15 is added to limit the ESD current flowing through a short-channel NMOS 25 in the secondary stage 20. The resistance value of the resistor 15 is dependent on the turn-on voltage of the ESD clamp device in the primary stage 10 and the current $I_{t2}$ (secondary breakdown current) of the short-channel NMOS 25 in the secondary stage 20. Such a two-staged ESD protection design can provide high ESD level protection for digital input pins. However, the large series resistance and the large junction capacitance in the ESD clamp devices will cause a long RC timing delay to the input signal. Therefore, this design is not suitable for analog pins, especially for radio frequency (RF) signal applications.

Due to the features of the high frequency applications, parasitic capacitance of the ESD protection device will degrade the power gain performance of RF circuits. In order to solve this problem, the prior art tried to minimize the area of the ESD protection device to reduce the parasitic capacitance of the ESD protection device. This solution, however, also degrades the ESD protection level, so it is necessary to minimize the effects of the parasitic capacitance of the ESD clamp devices for the RF circuits.

Some protection circuits have been proposed to achieve the above objectives, as follows.

Reversed-Biased Diodes with $V_{DD}$-to-$V_{SS}$ Power-Rail Clamp Circuit

In order to reduce the loading capacitance to an input pin of RF circuits, diodes in the ESD protection circuits are designed with a small device dimension. With a small device dimension, the NDIO (PDIO) diode under the PS-mode (ND-mode) ESD stress (shown in FIG. 2) operates in the junction breakdown to discharge the ESD current. Typically, the diode under breakdown operation can only offer a low-level ESD protection. To avoid the small diodes from operating under breakdown condition during the PS-mode and ND-mode ESD stresses, and thus limit the ESD protection level of the entire circuit, a turn-on efficient ESD clamp circuit is inserted between the power rails to significantly increase the overall ESD protection level. The ESD circuit structure is shown in FIG. 3.

When the RF input pin is zapped with NS-mode (PD-mode) ESD stress, the NDIO (PDIO) diode operates under a forward-biased condition to discharge the ESD current. The diodes operating under the forward-biased condition can sustain a much higher ESD level than those operating under a reverse-biased breakdown condition. The RC-based ESD detection circuit 30 is used to trigger on the MNESD device, when the RF INPUT PAD 400 is zapped with the PS-mode or ND-mode ESD stress. The ESD current paths in this RF ESD protection design, under the PS-mode and ND-mode ESD stresses, are respectively illustrated by the dashed lines $I_{ESD}$ in FIG. 4 and FIG. 5. Because the NDIO diode in the PS-mode ESD stress is not operating under the breakdown condition, the ESD current is bypassed through the forward-biased PDIO diode and the turned-on MNESD between the VDD/VSS power rails. Similarly, the ND-mode ESD current is discharged as the dashed line illustrates in FIG. 5 with the NDIO diode operating under a forward-biased condition and the turned-on MNESD between the $V_{DD}/V_{SS}$ power rails. The MNESD is especially designed with a larger device dimension to sustain a high-level ESD. Although the large-dimension MNESD has a large junction capacitance, the capacitance does not contribute to the RF INPUT PAD 400. By using this ESD protection design, the RF INPUT pin can sustain much higher ESD levels under the four modes of ESD stresses, but only with small diodes connected to the RF INPUT PAD 400. This can reduce the loading capacitance generated from the ESD protection devices to the RF INPUT PAD 400.

Use of Inductor as an ESD Device

The Leuven University proposed a paper about LNA circuits with inductors and $V_{DD}$-to-$V_{SS}$ dual stacked diodes to against the ESD discharge. The inductor is a metallic low-pass passive device and is suitable for ESD protection devices. However, since the inductor is connected from the input to the ground, it will cause DC leakage from the input to the ground directly. Therefore, it needs to be coupled with a capacitor, in series, to block the input PAD and the input gate.

Distributed ESD Protection Device for High-Speed Integrated Circuits

Shown in FIG. 6 and FIG. 8 are distributed ESD protection devices for high-speed integrated circuits, which are inventions by Stanford University. FIG. 6 shows a one-stage matching structure 45, and FIG. 8 shows a four-stage matching structure, including 45a, 45b, 45c and 45d. FIG. 7 shows a trace in Smith Chart of parasitic capacitance of the ESD within a one-stage distributed matching structure, and FIG. 9 shows the same capacitance in a four-stage distributed matching structure. In FIG. 7, the parasitic capacitance of ESD (CA+CB) traverses down its path following the circle in Smith Chart from the origin. A transmission line TL will bring the path to the x-axis of Smith Chart. In FIG. 9, the parasitic capacitance (C4A+C4B) traverses down its path following the circle in Smith Chart from the origin. The transmission line TL4 will bring the route to the x-axis of Smith Chart. The same concept can be applied to illustrate the other parasitic capacitance (C3A+C3B), (C2A+C2B), and (C1A+C1B). The transmission lines TL3, TL2, and TL1 will bring their routes to the x-axis of Smith Chart.

$$(C1A+C1B)=(C2A+C2B)=(C3A+C3B)=(C4A+C4B)$$

A comparison of FIG. 7 and FIG. 9 shows that the more matching stages in the protective circuit, the closer the last position of the route is to the origin. The distance of the position to the origin is proportional to the signal power gain. Hence, having conditions with more stages matching leads to a better power gain. But it is hard to achieve uniform ESD current distribution amongst the numerous separated ESD sections during impulsive ESD events. The first ESD section, which is the closest to the input pad, will always receive the most bulk of the ESD current before the other sections are turned on to share the current. This causes damage to the first section and, ultimately, lowers the ESD protection threshold in the IC.

SUMMARY OF THE INVENTION

Accordingly, one object of the present invention is to provide an electrostatic discharge (ESD) protection circuitry, which can be used in a radio frequency (RF) circuitry for electrostatic discharge protection.

Accordingly, one object of the present invention is to provide an electrostatic discharge (ESD) protection circuitry, which considers the power gain performance of the RF circuitry and the ESD level.

To achieve these and other advantages and in accordance with the purpose of the invention, as embodied and broadly described herein, the invention provides an ESD protection circuit device for Giga-Hertz RF integrated circuits which overcome the problems associated with prior art techniques while raising the ESD protection threshold. The new proposed ESD protection design are stacked with LC tanks in the Input/Output (I/O) port with $V_{DD}$-to-$V_{SS}$ power-rail clamp circuits. The values of inductance and capacitance in the LC tank can be properly selected by resonant at the RF operating frequency.

To achieve these and other advantages and in accordance with the purpose of the invention, as embodied and broadly described herein, the invention provides an electrostatic discharge (ESD) circuit, adaptive to a radio frequency (RF) device. The RF device includes a RF circuit with a VDD voltage RF pad, a VSS RF pad and a RF input pad. The ESD circuit comprises a ESD clamp circuit and a LC tank structure. The ESD clamp circuit includes two terminals, the first one of which is connected to the VDD voltage RF pad, and the second one of which is connected to the VSS RF pad. The LC tank structure is coupled between the two terminals of the ESD clamp circuit, and is located between the RF circuit and the RF input pad. The LC tank structure includes a first diode and a first LC tank connected in series between the first terminal of the ESD clamp circuit and the RF input pad, and a second diode and a second LC tank connected in series between the second terminal of the ESD clamp circuit and the RF input pad.

In the above-mentioned ESD circuit, in an alternative embodiment, an cathode terminal of the first diode is coupled to the first terminal of the ESD clamp circuit and a anode terminal of the first diode is coupled to the first LC tank, and an cathode terminal of the second diode is coupled to the second LC tank and a anode terminal of the second diode is coupled to the second terminal of the ESD clamp circuit.

In the above-mentioned ESD circuit, in an alternative embodiment, an cathode terminal of the first diode is coupled to the first LC tank and a anode terminal of the first diode is coupled to a terminal between the RF circuit and the RF input pad, and an cathode terminal of the second diode is coupled to the terminal between the RF circuit and the RF input pad and a anode terminal of the second diode is coupled to the second LC tank.

In the above-mentioned ESD circuit, in an alternative embodiment, the LC tank structure includes an inductor and a capacitor connected to each other in parallel.

To achieve these and other advantages and in accordance with the purpose of the invention, as embodied and broadly described herein, the invention provides an electrostatic discharge (ESD) circuit, adaptive to a radio frequency (RF) device. The RF device includes a RF circuit with a VDD voltage RF pad, a VSS RF pad and a RF input pad. The ESD circuit comprises a ESD clamp circuit and a LC tank structure. The ESD clamp circuit includes two terminals, the first one of which is connected to the VDD voltage RF pad, and the second one of which is connected to the VSS RF pad. The LC tank structure is coupled between the two terminals of the ESD clamp circuit, and is located between the RF circuit and the RF input pad, wherein the LC tank structure includes a first ESD block between the first terminal of the ESD clamp circuit and the RF input pad, and a second ESD block between the second terminal of the ESD clamp circuit and the RF input pad.

In the above-mentioned ESD circuit, in an alternative embodiment, the first ESD block includes a first diode and two first LC tanks connected in series, and the second ESD block includes a second diode and two second LC tanks.

In the above-mentioned ESD circuit, in an alternative embodiment, an cathode terminal of the first diode is coupled to the first terminal of the ESD clamp circuit and a anode terminal of the first diode is coupled to the one of the first LC tanks, and an cathode terminal of the second diode is coupled to one of the second LC tanks and a anode terminal of the second diode is coupled to the second terminal of the ESD clamp circuit.

In the above-mentioned ESD circuit, in an alternative embodiment, an cathode terminal of the first diode is coupled to one of the first LC tanks and a anode terminal of the first diode is coupled to a terminal between the RF circuit and the RF input pad, and an cathode terminal of the second diode is coupled to the terminal between the RF circuit and the RF input pad and a anode terminal of the second diode is coupled to the one of the second LC tanks.

In the above-mentioned ESD circuit, in an alternative embodiment, the first ESD block includes a first diode and a plurality of first LC tanks connected in series, and the second ESD block includes a second diode and a plurality of second LC tanks. Alternatively, an cathode terminal of the first diode is coupled to the first terminal of the ESD clamp circuit and a anode terminal of the first diode is coupled to the one of the first LC tanks, and an cathode terminal of the second diode is coupled to one of the second LC tanks and a anode terminal of the second diode is coupled to the second terminal of the ESD clamp circuit.

In the above-mentioned ESD circuit, in an alternative embodiment, an cathode terminal of the first diode is coupled to one of the first LC tanks and a anode terminal of the first diode is coupled to a terminal between the RF circuit and the RF input pad, and an cathode terminal of the second diode is coupled to the terminal between the RF circuit and the RF input pad and a anode terminal of the second diode is coupled to the one of the second LC tanks.

To achieve these and other advantages and in accordance with the purpose of the invention, as embodied and broadly described herein, the invention provides an electrostatic discharge (ESD) circuit, adaptive to a radio frequency (RF) device. The RF device includes a RF circuit with a VDD voltage RF pad, a VSS RF pad and a RF input pad. The ESD circuit comprises an ESD clamp circuit and a LC tank structure. The ESD clamp circuit includes two terminals, the first one of which is connected to the VDD voltage RF pad, and the second one of which is connected to the VSS RF pad. The LC tank structure is coupled between the two terminals of the ESD clamp circuit, and between the RF circuit and the RF input pad. The LC tank structure includes a first diode, a first LC tank and a first ESD block connected in series between the first terminal of the ESD clamp circuit and the RF input pad, and a second diode, a second LC tank and a second ESD block connected in series between the second terminal of the ESD clamp circuit and the RF input pad.

In the above-mentioned ESD circuit, in an alternative embodiment, the first ESD block includes a third diode and a third LC tank connected in series. Alternatively, an cathode terminal of the third diode is coupled to the first terminal of the ESD clamp circuit and a anode terminal of the third diode is coupled to the third LC tank. Alternatively, an cathode terminal of the third diode is coupled to the third LC tank and a anode terminal of the third diode is coupled to the first LC tank. In another embodiment, the third LC tank includes an inductor and a capacitor connected to each other in parallel.

In the above-mentioned ESD circuit, in an alternative embodiment, the second ESD block includes a forth diode and a forth LC tank connected in series. Alternatively, an cathode terminal of the forth diode is coupled to the forth LC tank and a anode terminal of the forth diode is coupled to the second terminal of the ESD clamp circuit. Alternatively, an cathode terminal of the forth diode is coupled to the second LC tank and a anode terminal of the forth diode is coupled to the second terminal of the ESD clamp circuit. In another embodiment, the forth LC tank includes an inductor and a capacitor connected to each other in parallel.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
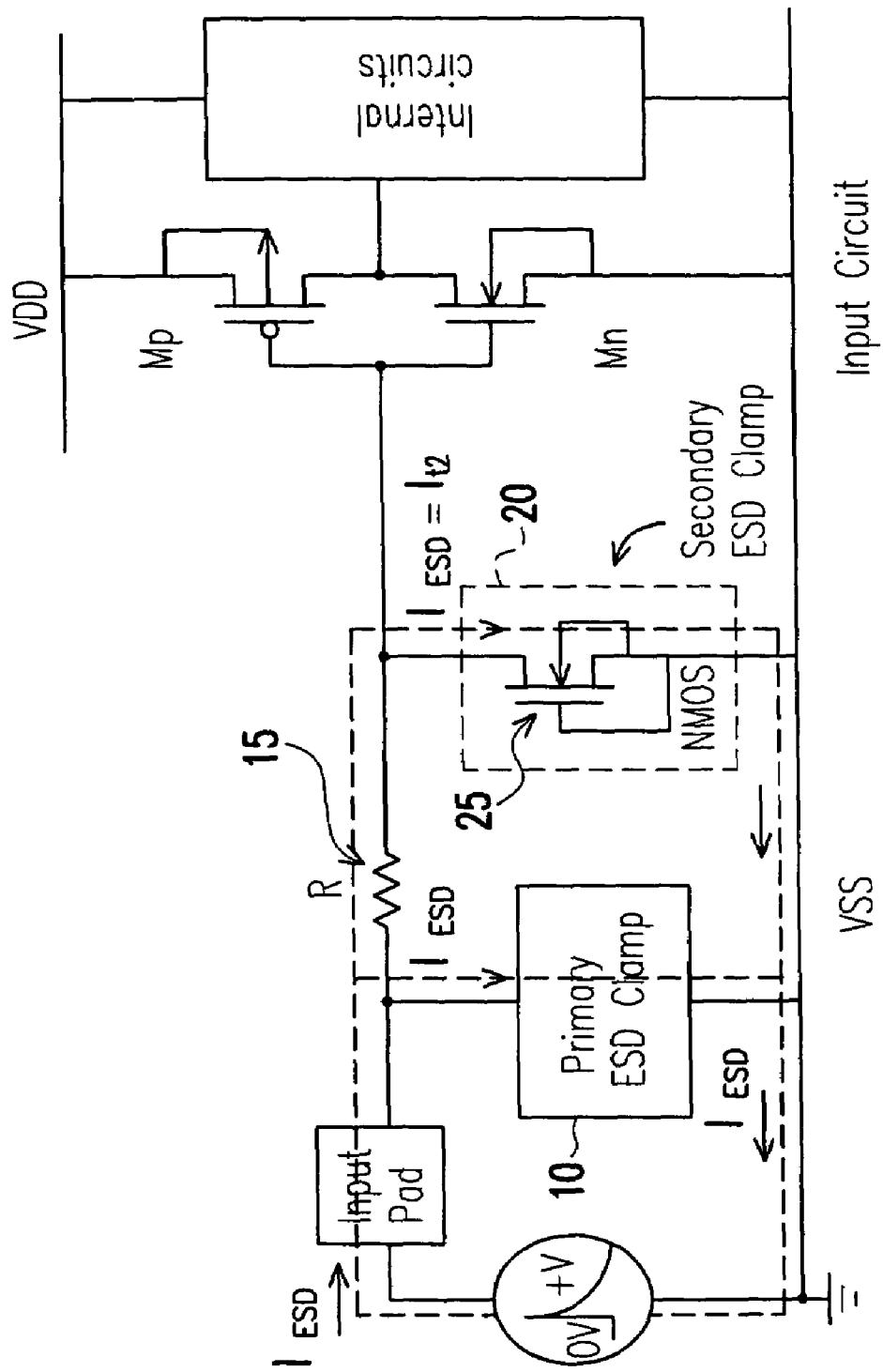
FIG. 1 is a block diagram showing a traditional ESD protection design with a two-staged protection structure for a digital IC.

Reference will now be made in detail to the present preferred embodiments of the invention, examples of which are illustrated in the accompanying drawings. Wherever possible, the same reference numbers are used in the drawings and the description to refer to the same or like parts.

The present invention provides an electrostatic discharge (ESD) protection circuitry, which can be used in a radio frequency (RF) circuitry for electrostatic discharge protection. The ESD protection circuitry considers the power gain performance of the RF circuitry and the ESD level and overcomes the problems associated with prior art techniques while raising the ESD protection threshold. The new proposed ESD protection design is stacked with one or more LC tanks in the Input/Output (I/O) port with $V_{DD}$-to-$V_{SS}$ power-rail clamp circuits. The values of inductance and capacitance in the LC tank can be selected by resonant at the RF operating frequency.

For example, the values of inductance and capacitance can be selected by applying the following formula to resonant at the operating frequency of each individual RF circuit.

$$jwL // \frac{1}{jwC} = \infty$$

$$\frac{1}{\frac{1}{jwL} + jwC} = \infty$$

$$\frac{1}{jwL} + jwC = 0$$

$$w^2 = \frac{1}{LC}$$

$$w = \frac{1}{\sqrt{LC}}$$

This prevents the loss of signals to ground due to the infinite resistance seen by signals. In the formula, w represents the operating frequency of the RF circuit. The values of the inductance and capacitance of the LC tank will also determine the loss of power gain, so simulation tools are used to select the optimal values. In the ESD condition, the ESD current will be discharged through the ESD device and the inductor. The inductors are made of the top thick metal in general and are metal lines with low parasitic resistance. Thus, in the proposed designs, the novel LC tank ESD circuits will result in higher-level ESD protection for RF circuits.

In the following figures from FIG. 10 to FIG. 17, several embodiments are introduced for the invention, including ESD protection devices stacked with one or more LC tanks in the I/O port with $V_{DD}$-to-$V_{SS}$ power-rail clamp circuits.

ESD Circuit Stacked with a LC Tank Structure

Figure 10:
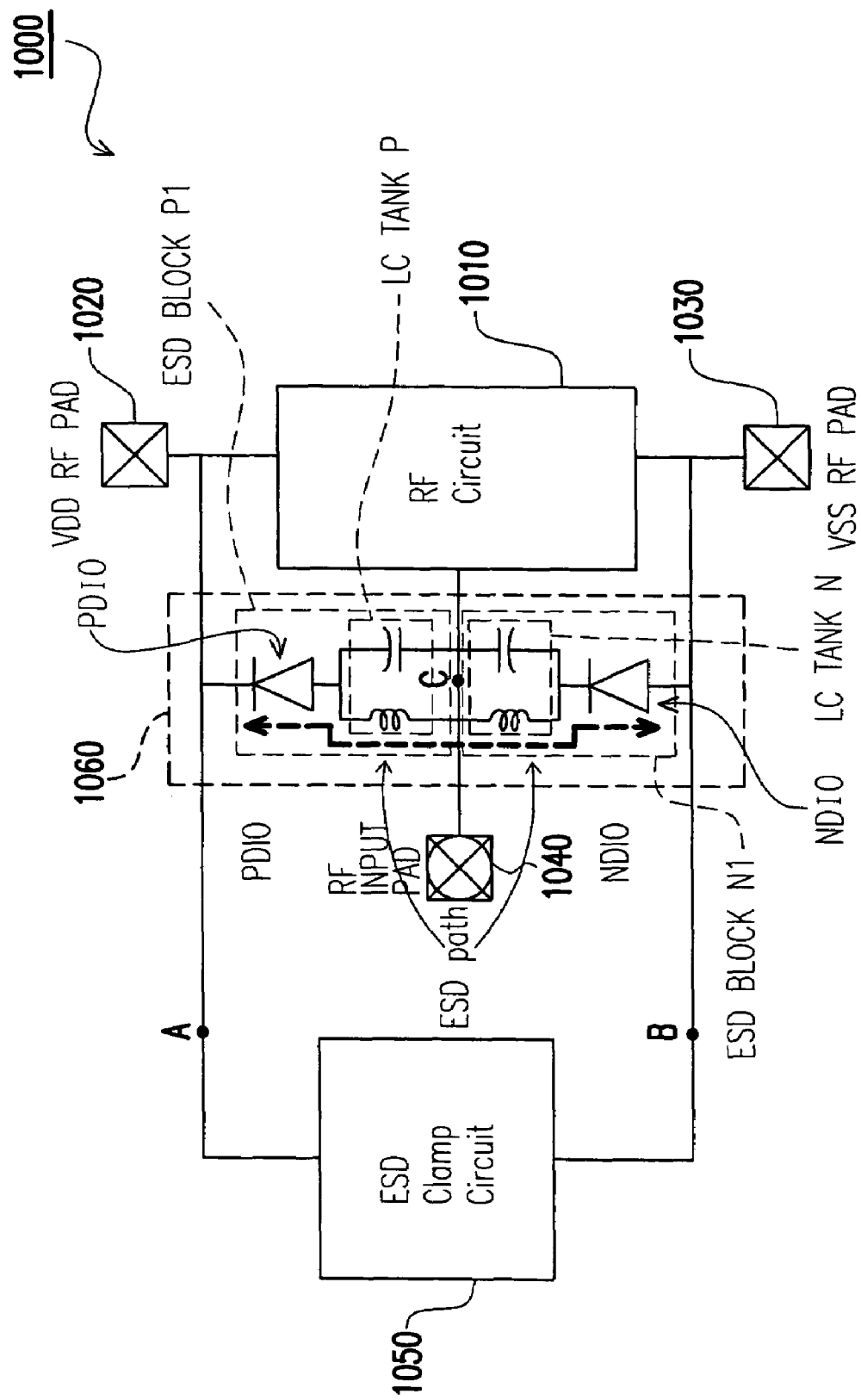
FIGS. 10–17 are block diagrams showing an ESD protection design of preferred embodiments of the invention and their responding ESD current paths.

Please refer to FIG. 10, which depicts a RF circuit device 1000 with an ESD circuit stacked with a LC tank structure 1060 (ESD BLOCK N1 and ESD BLOCK P1) of a preferred embodiment of the invention. The RF circuit device 1000 includes a RF circuit 1010 with a VDD voltage RF pad 1020, a VSS RF pad 1030 and a RF input pad 1040 is provided in FIG. 10. Between the RF circuit 1010 and the RF input pad 1040 is the ESD circuit. The ESD circuit includes a $V_{DD}$-to-$V_{SS}$ power-rail clamp circuit 1050 and a LC tank structure 1060. The LC tank structure 1060 includes two ESD blocks, including ESD BLOCK N1 and ESD BLOCK P1.

The ESD BLOCK N1 and ESD BLOCK P1 respectively includes a diode NDIO, a diode PDIO and two LC tanks LC TANK N and LC TANK P, which are connected in series. Each of the LC tanks LC TANK N and LC TANK P includes an inductor and capacitor, which are connected in parallel. The diode PDIO includes an cathode terminal coupled to a first terminal A of the ESD clamp circuit 1050 and a anode terminal coupled to the LC TANK P. The diode NDIO includes an cathode terminal coupled to LC TANK N and a anode terminal coupled to a second terminal B of the ESD clamp circuit 1050. A terminal C between the RF circuit 1010 and the RF input pad 1040 is connected to both of the LC tanks LC TANK N and LC TANK P.

When the LC tank is resonant to the RF frequency, there is infinite impedance, thus minimizing the power gain loss. The ESD current will be discharged through the inductors and the ESD diodes, as the bold dash lines shown in the FIG. 10. To avoid the diodes from operating under breakdown condition during the PS-mode and ND-mode ESD stresses, which results in a lower ESD protection level, a turn-on efficient $V_{DD}$-to-$V_{SS}$ ESD clamp circuit 1050, between the power rails, is constructed into the ESD protection circuit. This $V_{DD}$-to-$V_{SS}$ ESD clamp circuit can significantly increase the overall ESD protection.

When the RF INPUT pad 1040 is zapped with one of the four ESD stress modes, the NDIO diode or the PDIO diode operates under a forward-biased condition with the corresponding inductor to discharge the ESD current. Diodes operating under forward-biased condition can sustain a much higher ESD level than those operating under reverse-biased breakdown condition. The $V_{DD}$-to-$V_{SS}$ ESD clamp circuit 1050 is turned on when the RF INPUT PAD 1040 is zapped with PS-mode or ND-mode ESD stresses. The ESD current is bypassed through the forward-biased PDIO diode and the turned-on $V_{DD}$-to-$V_{SS}$ ESD clamp circuit 1050 between the $V_{DD}/V_{SS}$ power rails, because the NDIO diode, in PS-mode ESD stress, does not operate under the breakdown condition. Similarly, the NDIO diode and the corresponding inductor operates under the forward-biased condition with the $V_{DD}$-to-$V_{SS}$ ESD clamp circuit 1050, between the $V_{DD}/V_{SS}$ power rails, to safely discharge the ND-mode ESD current.

Figure 2:
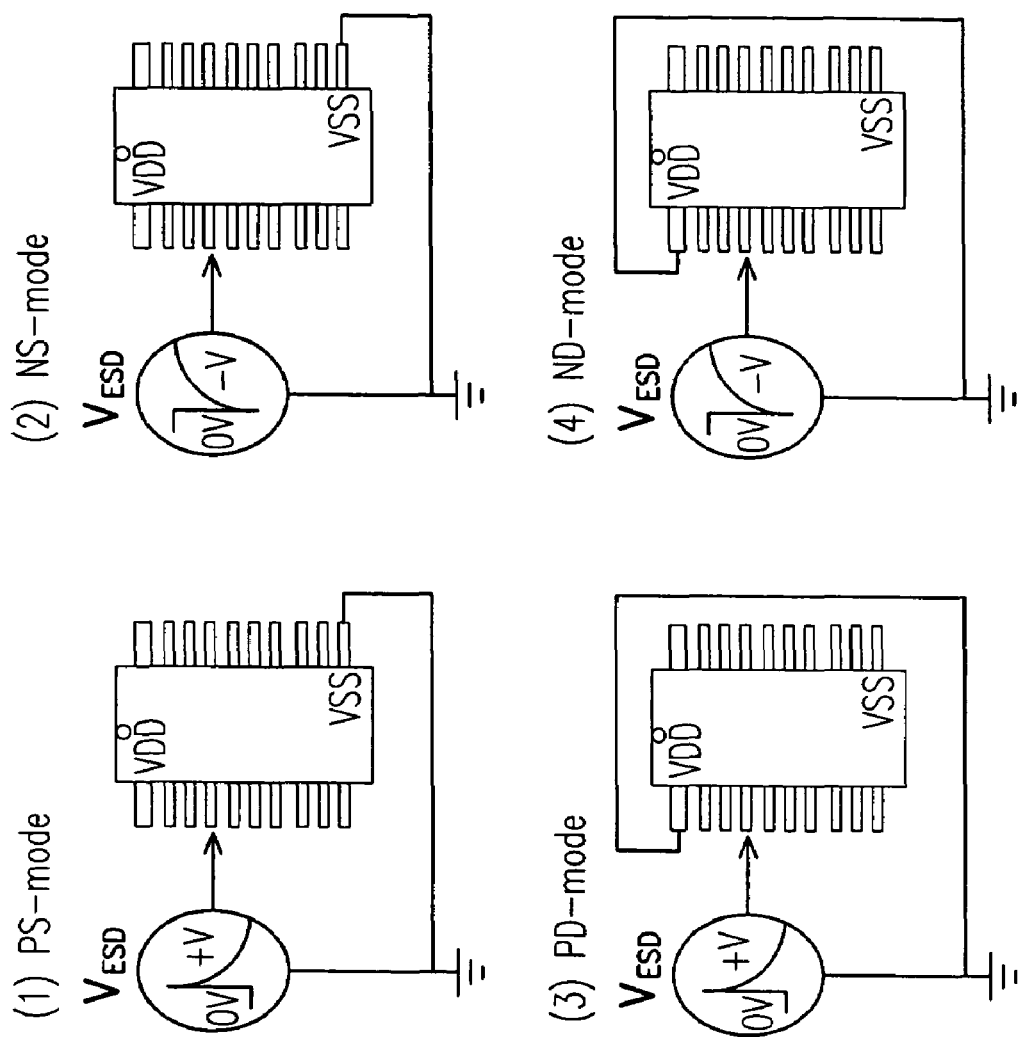
FIG. 2 shows four modes of ESD zapping on an I/O pin with $V_{DD}$ or $V_{SS}$ relatively grounded, which are positive-to-$V_{SS}$ (PS) mode, negative-to-$V_{SS}$ (NS) mode, positive-to-$V_{DD}$ (PD) mode, and negative-to-$V_{DD}$ (ND) mode.
Figure 3:
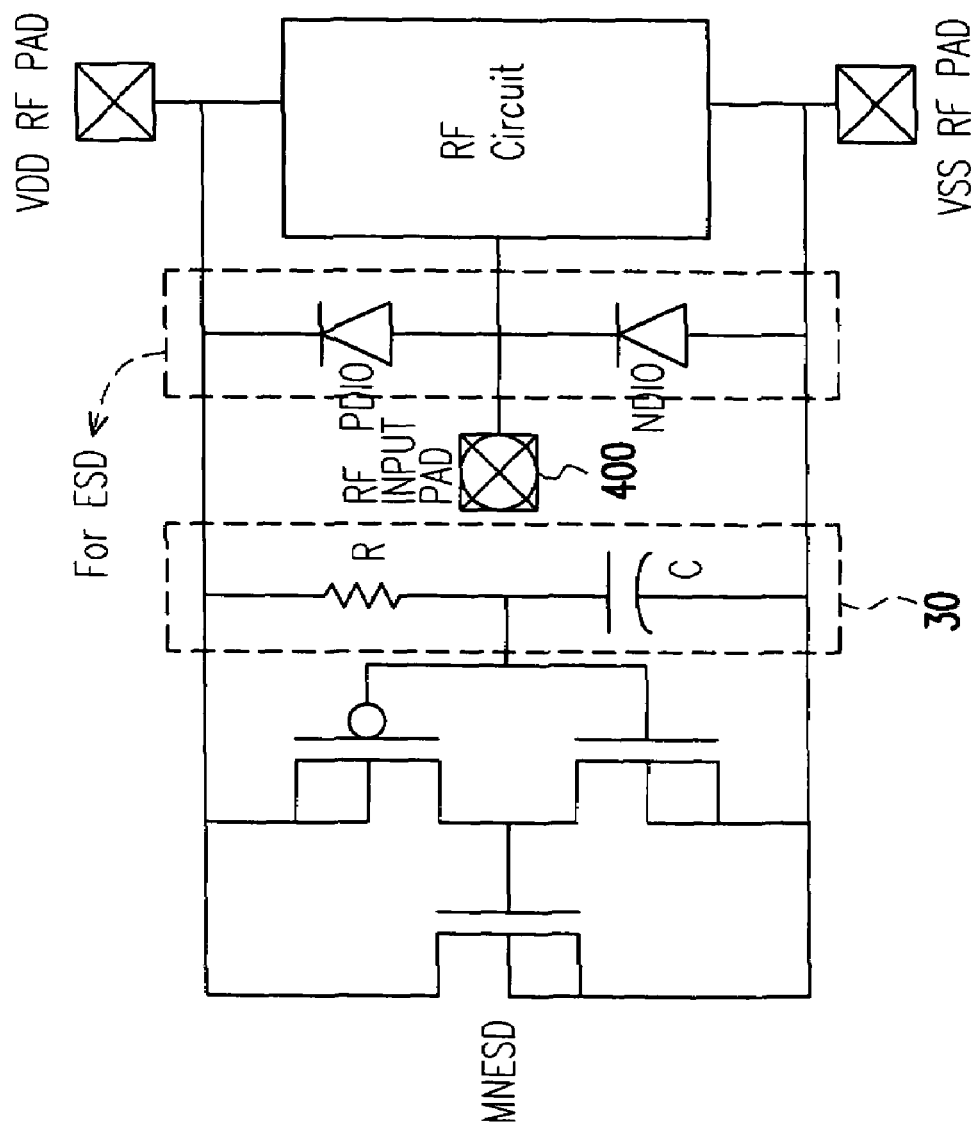
FIG. 3 is a block diagram showing the traditional ESD protection design with a two-staged protection structure for a RF circuit.
Figure 4:
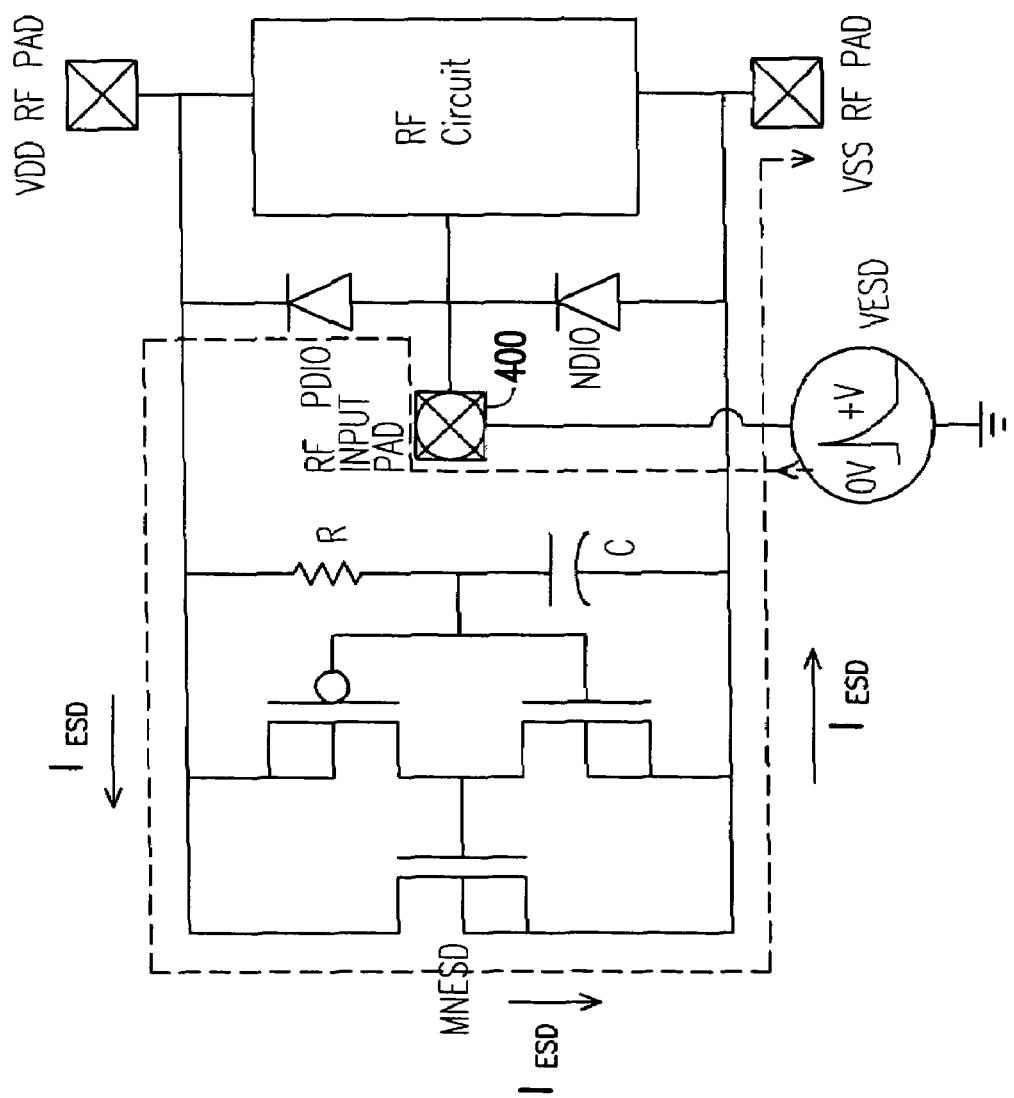
FIGS. 4 and 5 show ESD current paths in the RF ESD protection design of FIG. 3, under a PS-mode and a ND-mode ESD stresses.
Figure 5:
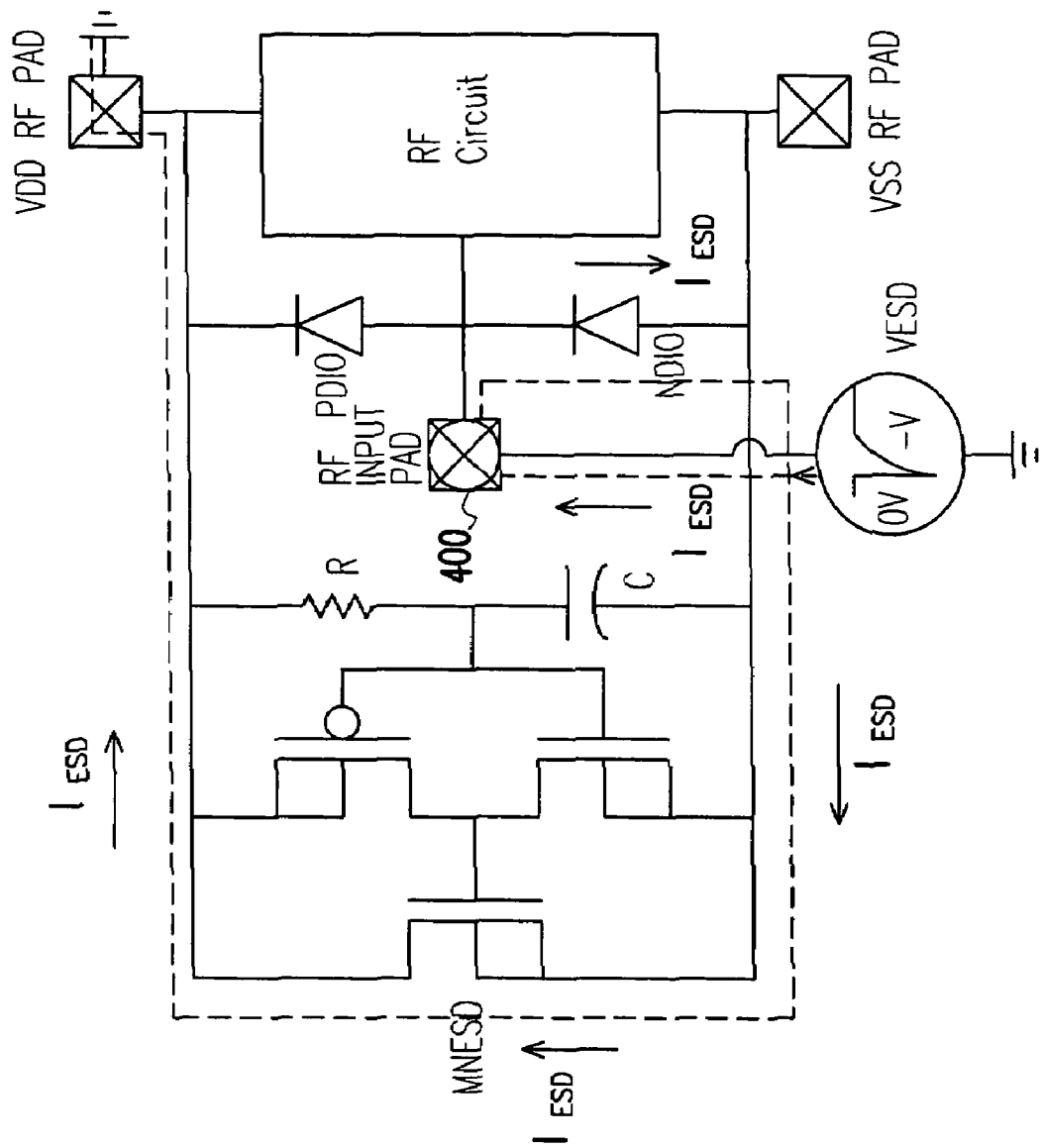
Figure 6:
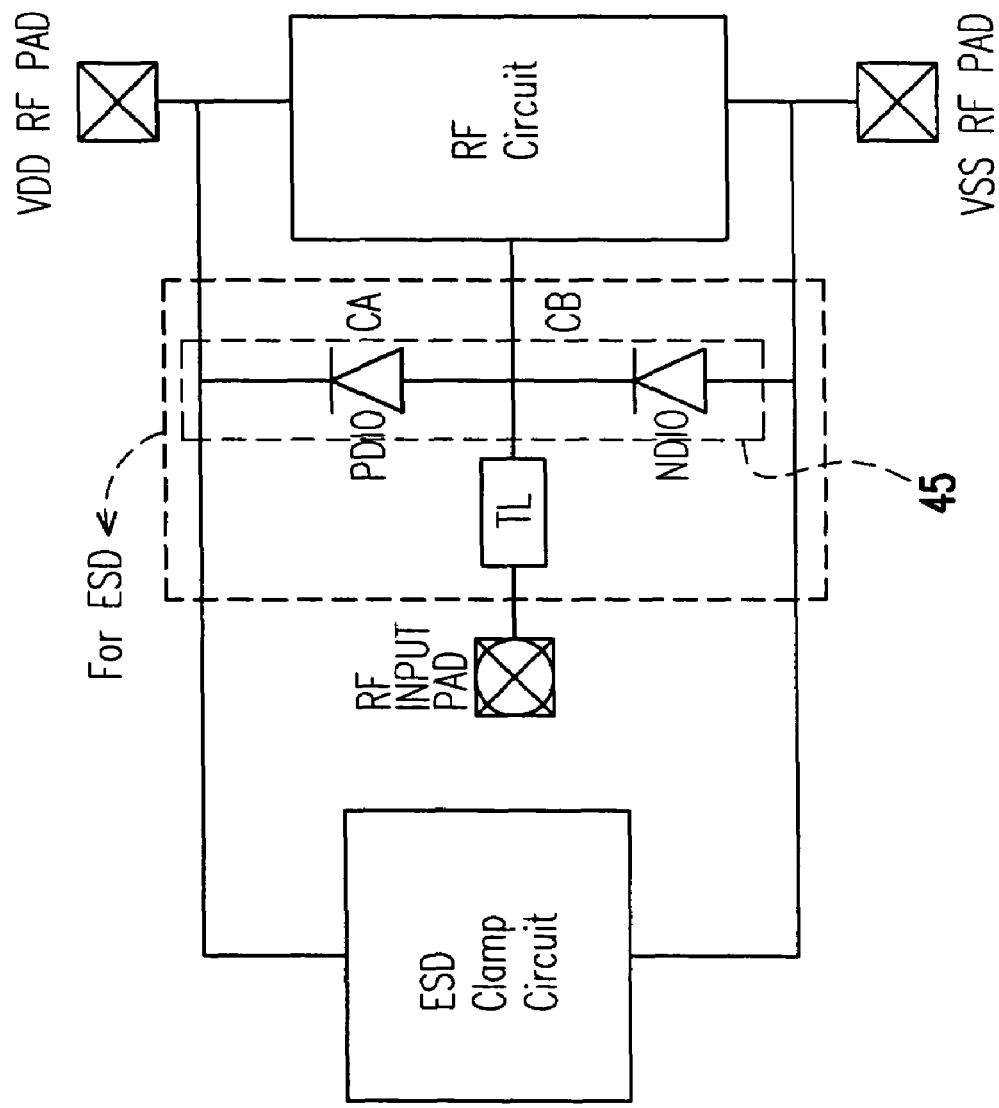
FIG. 6 and FIG. 8 shows distributed ESD protection devices for high-speed integrated circuits, which are inventions by Stanford University.
Figure 7:
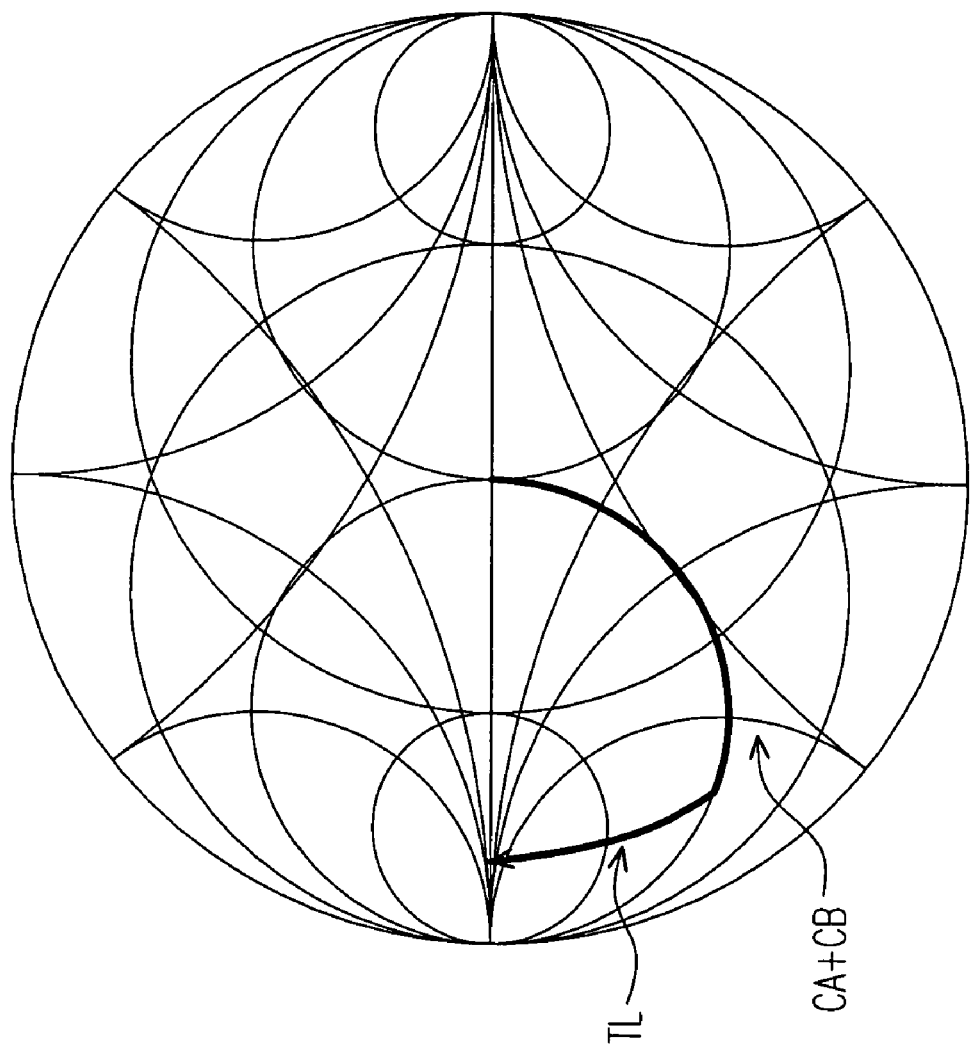
FIG. 7 shows the parasitic capacitance of ESD (CA+CB) of FIG. 6 traverses down its path following the circle in Smith Chart from the origin.
Figure 8:
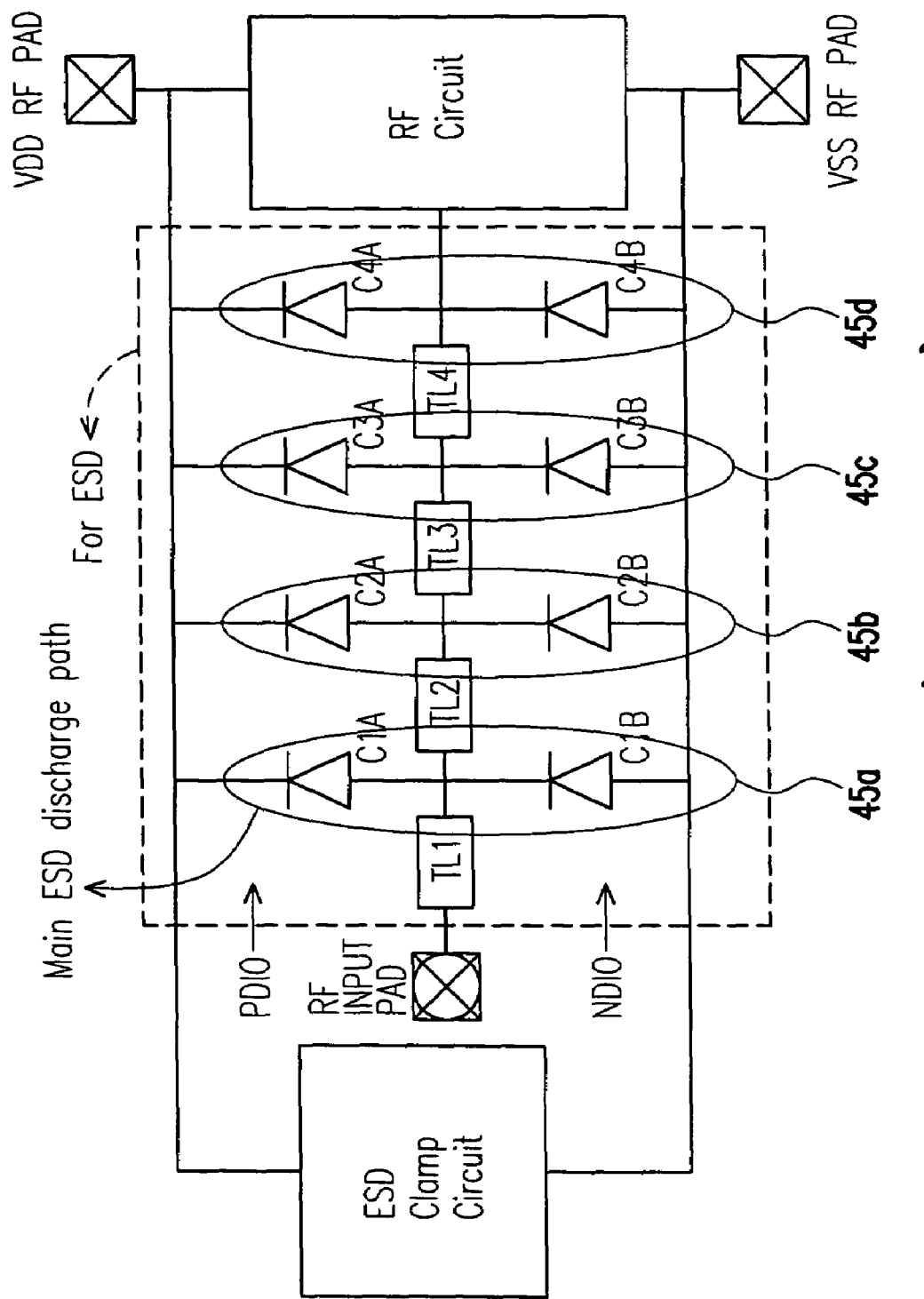
Figure 9:
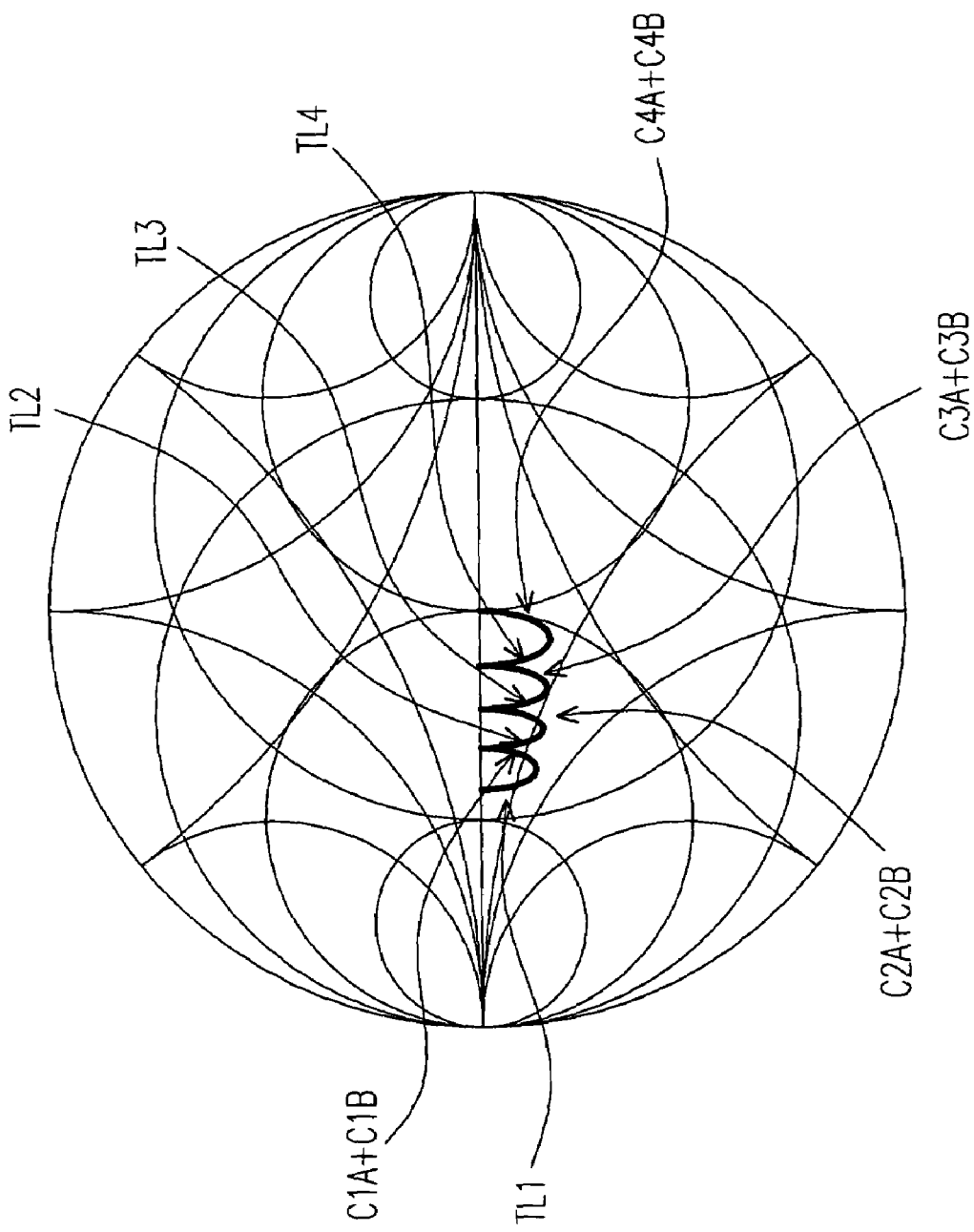
FIG. 9 shows the parasitic capacitance of ESD (C4A+C4B) of FIG. 8 traverses down its path following the circle in Smith Chart from the origin.

The $V_{DD}$-to-$V_{SS}$ ESD clamp circuit 1050 is especially designed with a larger device dimension to sustain a high-level ESD. Although the large-dimension $V_{DD}$-to-$V_{SS}$ ESD clamp circuit 1050 has a large junction capacitance, this capacitance does not contribute to the RF INPUT PAD 1040. By applying this ESD protection design, the RF INPUT pin can sustain much higher levels of ESD in the four ESD stress modes (as shown in FIG. 2). Therefore, the loading capacitance generated from the PDIO diode and the NDIO diode of the ESD protection device to the RF INPU PAD 1040 can be significantly avoided by the insertion of the LC tank. Hence, there will be no significant degradation of performance in the RF IC.

Figure 11:
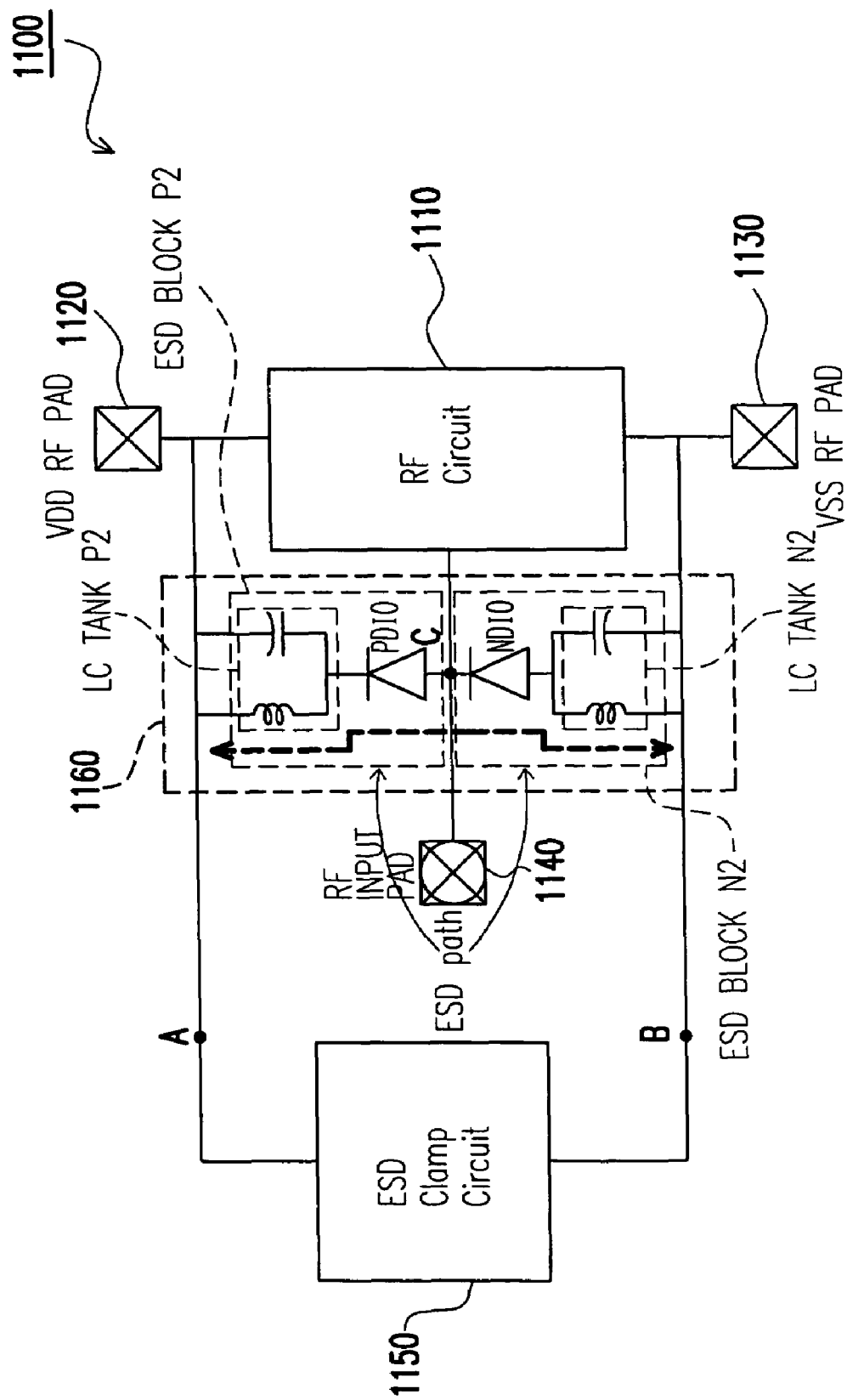

FIG. 11 depicts a RF circuit device 1100 with an ESD circuit stacked with a LC tank structure 1160, which includes two ESD blocks ESD BLOCK N2 and ESD BLOCK P2, in another preferred embodiment of the invention. In the alternative design, compared with elements in the FIG. 10, the positions of the LC tank LC TANK P2 and the diode PDIO are switched and the positions of the LC tank LC TANK N2 and the diode NDIO are also switched. The RF circuit device 1100 includes a RF circuit 1110 with a VDD voltage RF pad 1120, a VSS RF pad 1130 and a RF input pad 1140 is provided in FIG. 11. Between the RF circuit 1110 and the RF input pad 1140 is the ESD circuit. The ESD circuit is constructed by a $V_{DD}$-to-$V_{SS}$ power clamp circuit 1150 and the LC tank structure 1160. The LC tank structure 1160 includes two ESD blocks, ESD BLOCK N2 and ESD BLOCK P2.

The ESD BLOCK N2 includes a LC tank LC TANK N2 and a diode NDIO. The ESD BLOCK P2 includes a LC tank LC TANK P2 and a diode PDIO. The two LC tanks and the diodes are connected in series. Each of the LC tanks LC TANK N2 and LC TANK P2 includes an inductor and capacitor, connected in parallel. The diode PDIO includes an cathode terminal coupled to the LC tank LC TANK P2 and a anode terminal connected to a terminal C between the RF circuit 1110 and the RF input pad 1140. The diode NDIO includes an cathode terminal coupled to the terminal C between the RF circuit 1110 and the RF input pad 1140 and a anode terminal coupled to the LC tank LC TANK N2. The other terminal of the LC TANK P2 opposite to the terminal connected to the PDIO is connected to a first terminal A of the ESD clamp circuit 1150. The other terminal of the LC TANK N2 opposite to the terminal connected to the NDIO is connected to a second terminal B of the ESD clamp circuit 1150.

When the LC tank is resonant to the RF frequency, there is infinite impedance, thus minimizing the power gain loss. The ESD current will be discharged through the inductors and the ESD diodes, as the bold dash lines shown in the FIG. 11. To avoid the diodes from operating under breakdown condition during the PS-mode and ND-mode ESD stresses, which results in a lower ESD protection level, a turn-on efficient $V_{DD}$-to-$V_{SS}$ ESD clamp circuit 1150, between the power rails, is constructed into the ESD protection circuit. This $V_{DD}$-to-$V_{SS}$ ESD clamp circuit can significantly increase the overall ESD protection.

The $V_{DD}$-to-$V_{SS}$ ESD clamp circuit 1150 is especially designed with a larger device dimension to sustain a high-level ESD. Although the large-dimension $V_{DD}$-to-$V_{SS}$ ESD clamp circuit 1150 has a large junction capacitance, this capacitance does not contribute to the RF INPUT PAD 1140. By applying this ESD protection design, the RF INPUT pin can sustain much higher levels of ESD in the four ESD stress modes (as shown in FIG. 2). Therefore, the loading capacitance generated from the PDIO diode and the NDIO diode of the ESD protection device to the RF INPUT PAD 1140 can be significantly avoided by the insertion of the LC tank. Hence, there will be no significant degradation of performance in the RF IC.

ESD Circuit Stacked with Stacked LC Tank Structure

To consider the parasitic effect of inductors and capacitors implemented on the chip, a LC tank structure with LC tanks stacked in series is provided in the invention to achieve higher impedance at resonation. By such implementation, the power gain performance of the RF circuitry and the ESD level are considered. Please refer to FIG. 12, which depicts a RF circuit device 1200 with an ESD circuit stacked with a LC tank structure 1260 of a preferred embodiment of the invention. The RF circuit device 1200 includes a RF circuit 1210 with a VDD voltage RF pad 1220, a VSS RF pad 1230 and a RF input pad 1240 is provided in FIG. 12. Between the RF circuit 1210 and the RF input pad 1240 is the ESD circuit. The ESD circuit includes a $V_{DD}$-to-$V_{SS}$ power clamp circuit 1250 and a LC tank structure 1260. The LC tank structure 1260 includes a first stacked LC tank block 1260SLCP, a ESD diode PDIO, a second stacked LC tank block 1260SLCN and another ESD diode NDIO connected in series. Each of the stacked LC tank blocks includes at least two LC tanks stacked in series together. The diode PDIO includes an cathode terminal coupled to a first terminal A of the ESD clamp circuit 1250 and a anode terminal coupled to the first stacked LC tank block 1260SLCP. The diode NDIO includes an cathode terminal coupled to the second stacked LC tank block 1260SLCN and a anode terminal coupled to a second terminal B of the ESD clamp circuit 1250. A terminal C between the RF circuit 1210 and the RF input pad 1240 is connected to both of the first stacked LC tank block 1260SLCP and a second stacked LC tank block 1260SLCN.

Figure 12:
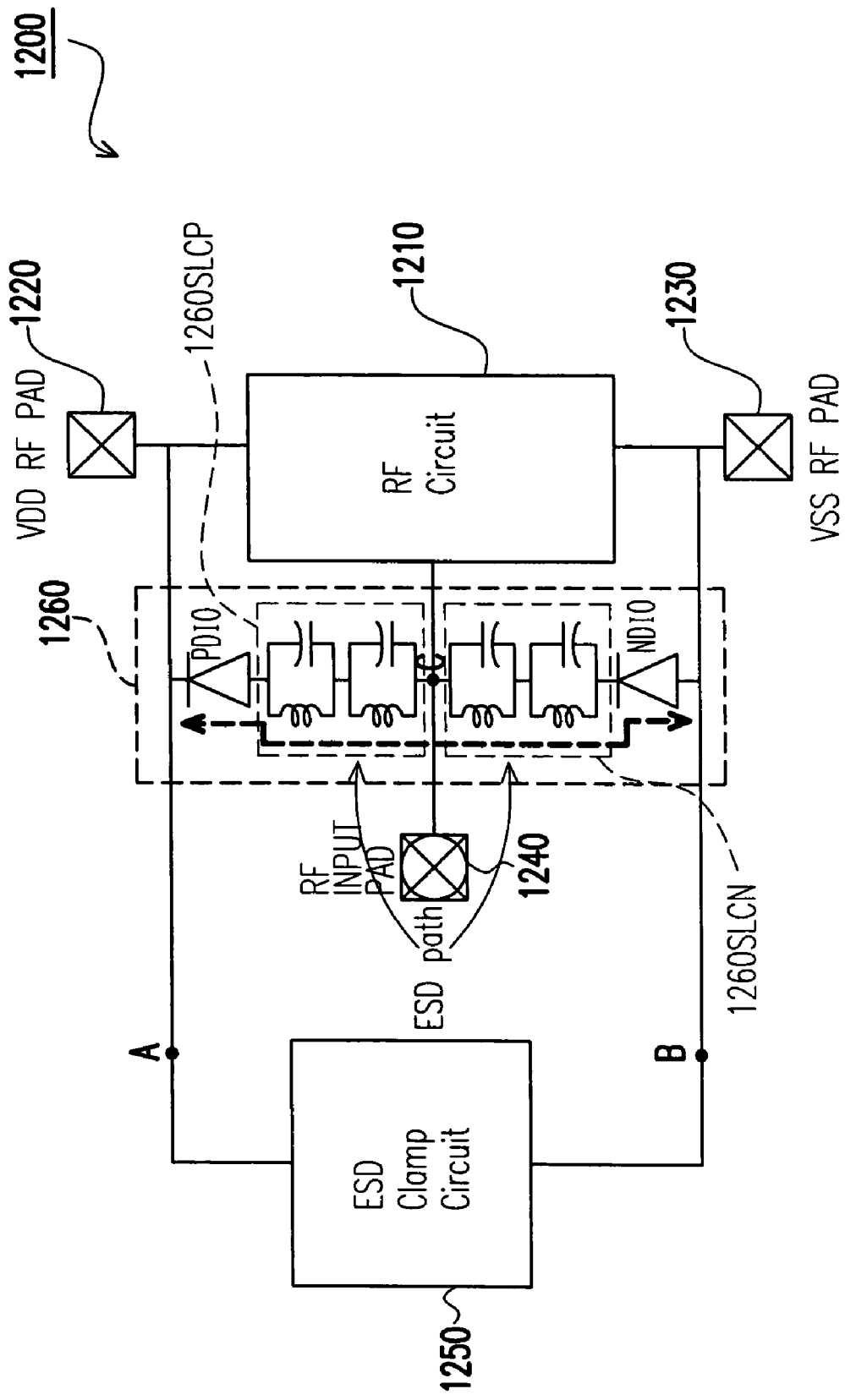

As previously mentioned, power gain loss is minimized when the LC tanks are resonant to the RF circuit frequency. The ESD current will be discharged through the inductors and the ESD diodes, as shown in FIG. 12. To avoid the diodes from operating under breakdown condition during the PS-mode and ND-mode ESD stresses, which results in a lowered ESD protection level, a turn-on efficient VDD-to-VSS ESD clamp circuit 1250, between the power rails, is constructed into the ESD protection circuit. This $V_{DD}$-to-$V_{SS}$ ESD clamp circuit can significantly increase the overall ESD protection.

When the RF INPUT pad 1240 is zapped with one of the four ESD stress modes, the NDIO or PDIO diode operates under the forward-biased condition with the inductor to discharge the ESD current. Diodes operating under the forward-biased condition can sustain a much higher ESD level than those operating under reverse-biased breakdown condition. The $V_{DD}$-to-$V_{SS}$ ESD clamp circuit 1250 is turned on when the RF INPUT PAD 1240 is zapped with PS-mode or ND-mode ESD stresses. The ESD current is bypassed through the forward-biased PDIO diode and the turned-on $V_{DD}$-to-$V_{SS}$ ESD clamp circuit 1250 between the $V_{DD}$/$V_{SS}$ power rails, because the NDIO diode, in PS-mode ESD stress, does not operate under the breakdown condition. Similarly, the NDIO diode and inductor operates under the forward-biased condition with the $V_{DD}$-to-$V_{SS}$ ESD clamp circuit 1250, between the $V_{DD}$/$V_{SS}$ power rails, to safely discharge ND-mode ESD current. The $V_{DD}$-to-$V_{SS}$ ESD clamp circuit 1250 is especially designed with a larger device dimension to sustain a high-level ESD. Although the large-dimension $V_{DD}$-to-$V_{SS}$ ESD clamp circuit 1250 has a large junction capacitance, this capacitance does not contribute to the RF input pad 1240. By applying this ESD protection design, the RF input pad 1240 can sustain much higher levels of ESD in the four ESD stress modes (FIG. 2). Therefore, the loading capacitance generated from the PDIO and NDIO of ESD protection devices to the RF input pad 1240 can be significantly avoided by the insertion of the LC tank. Hence, there will be no significant degradation of performance in RF IC.

Figure 13:
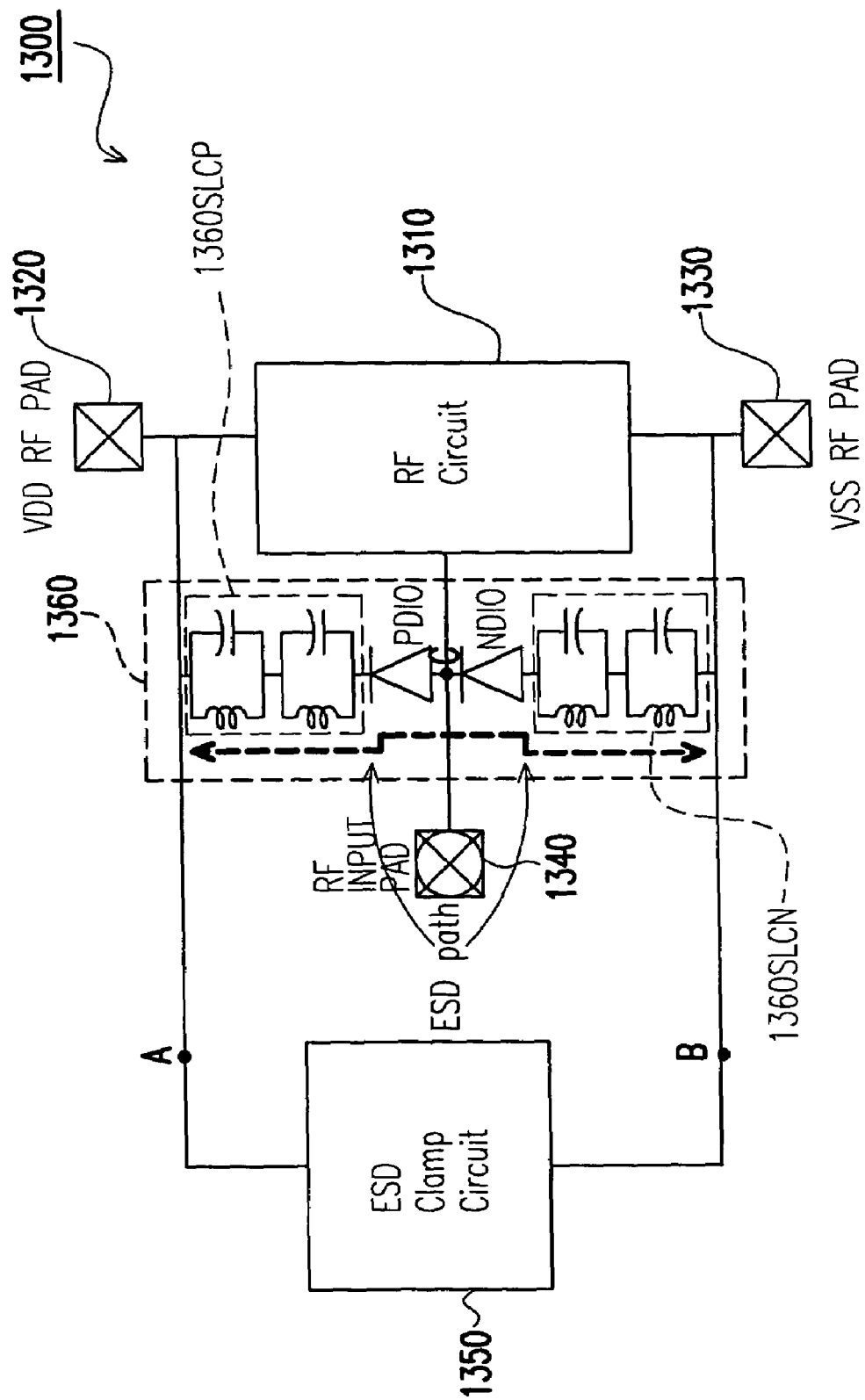

Please refer to FIG. 13, which depicts a RF circuit device 1300 with an ESD circuit stacked with a LC tank structure 1360 of another preferred embodiment of the invention, which considers the parasitic effect of inductors and capacitors implemented on the chip. In the alternative design, compared with elements in the FIG. 12, positions of the first stacked LC tank block 1360SLCP and the PDIO diode are switched, and positions of the second stacked LC tank block 1360SLCN and the NDIO diode are also switched. The RF circuit device 1300 includes a RF circuit 1310 with a VDD voltage RF pad 1320, a VSS RF pad 1330 and a RF input pad 1340 is provided in FIG. 13. Between the RF circuit 1310 and the RF input pad 1340 is the ESD circuit. The ESD circuit includes a $V_{DD}$-to-$V_{SS}$ power-rail clamp circuit 1350 and a LC tank structure 1360. The LC tank structure 1360 includes a first stacked LC tank block 1360SLCP and a second stacked LC tank block 1360SLCN connected in series. Each of the stacked LC tank blocks includes at least two LC tanks stacked in series together. The diode PDIO includes an cathode terminal coupled to the first stacked LC tank block 1360SLCP and a anode terminal connected to a terminal C between the RF circuit 1310 and the RF input pad 1340. The diode NDIO includes an cathode terminal coupled to the terminal C between the RF circuit 1310 and the RF input pad 1340 and a anode terminal coupled to the second stacked LC tank block 1360SLCN. The other terminal of the first stacked LC tank block 1360SLCP opposite to the terminal connected to the PDIO is connected to a first terminal A of the ESD clamp circuit 1350. The other terminal of the second stacked LC tank block 1360SLCN opposite to the terminal connected to the NDIO is connected to a second terminal B of the ESD clamp circuit 1350.

As previously mentioned, power gain loss is minimized when the LC tanks are resonant to the RF circuit frequency. The ESD current will be discharged through the inductors and the ESD diodes, as shown in FIG. 13. To avoid the diodes from operating under breakdown condition during the PS-mode and ND-mode ESD stresses, which results in a lower ESD protection level, a turn-on efficient $V_{DD}$-to-$V_{SS}$ ESD clamp circuit 1350, between the power rails, is constructed into the ESD protection circuit. This $V_{DD}$-to-$V_{SS}$ ESD clamp circuit can significantly increase the overall ESD protection.

When the RF INPUT pad 1340 is zapped with one of the four ESD stress modes, the NDIO or PDIO diode operates under the forward-biased condition with the inductor to discharge the ESD current. Diodes operating under the forward-biased condition can sustain a much higher ESD level than those operating under reverse-biased breakdown condition. The $V_{DD}$-to-$V_{SS}$ ESD clamp circuit 1350 is turned on when the RF INPUT PAD 1340 is zapped with PS-mode or ND-mode ESD stresses. The ESD current is bypassed through the forward-biased PDIO diode and the turned-on $V_{DD}$-to-$V_{SS}$ ESD clamp circuit 1350 between the $V_{DD}$/$V_{SS}$ power rails, because the NDIO diode, in PS-mode ESD stress, does not operate under the breakdown condition. Similarly, the NDIO diode and inductor operates under the forward-biased condition with the $V_{DD}$-to-$V_{SS}$ ESD clamp circuit 1350, between the $V_{DD}$/$V_{SS}$ power rails, to safely discharge ND-mode ESD current. The $V_{DD}$-to-$V_{SS}$ ESD clamp circuit 1350 is especially designed with a larger device dimension to sustain a high-level ESD. Although the large-dimension $V_{DD}$-to-$V_{SS}$ ESD clamp circuit 1350 has a large junction capacitance, this capacitance does not contribute to the RF input pad 1340. By applying this ESD protection design, the RF input pad 1340 can sustain much higher levels of ESD in the four ESD stress modes (FIG. 2). Therefore, the loading capacitance generated from the PDIO and NDIO of ESD protection devices to the RF input pad 1340 can be significantly avoided by the insertion of the LC tank. Hence, there will be no significant degradation of performance in RF IC.

Figure 14:
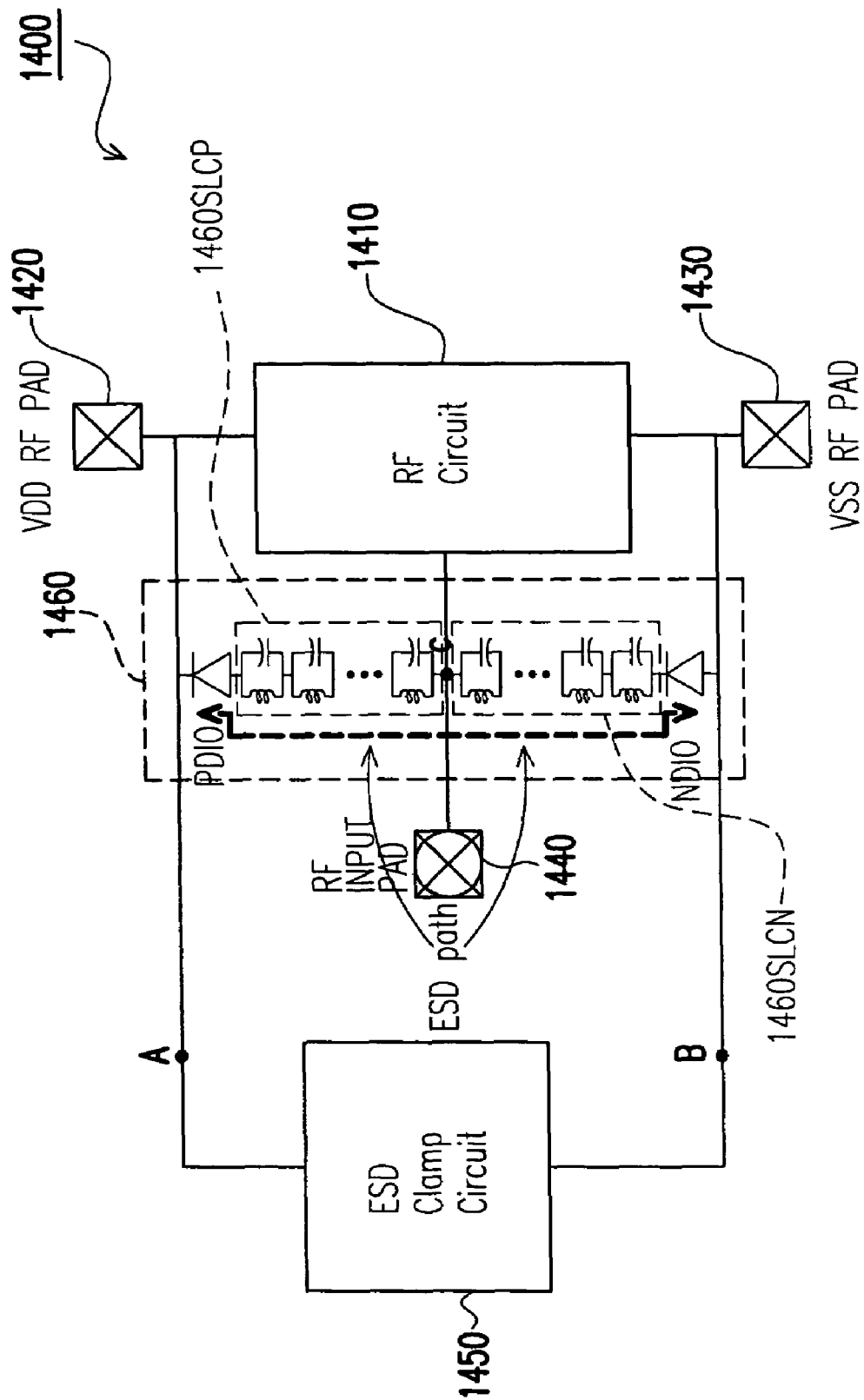

In alternative embodiment as shown in FIG. 14, a LC tank structure with n-stage LC tanks stacked in series is provided to achieve higher impedance at resonance. By such implementation, the power gain performance of the RF circuitry and the ESD level are both considered. In FIG. 14, which depicts a RF circuit device 1400 with an ESD circuit stacked with a LC tank structure 1460. The RF circuit device 1400 includes a RF circuit 1410 with a VDD voltage RF pad 1420, a VSS RF pad 1430 and a RF input pad 1440. Between the RF circuit 1410 and the RF input pad 1440 is the ESD circuit. The ESD circuit includes a $V_{DD}$-to-$V_{SS}$ power clamp circuit 1450 and a LC tank structure 1460. The LC tank structure 1460 includes a first n-stage stacked LC tank block 1460SLCP, a ESD diode PDIO, a second n-stage stacked LC tank block 1460SLCN, and a ESD diode NDIO connected in series. Each of the stacked LC tank blocks includes at least two LC tanks stacked in series together. The diode PDIO includes an cathode terminal coupled to a first terminal A of the ESD clamp circuit 1450 and a anode terminal coupled to the first n-stage stacked LC tank block 1460SLCP. The diode NDIO includes an cathode terminal coupled to the second n-stage stacked LC tank block 1460SLCN and a anode terminal coupled to a second terminal B of the ESD clamp circuit 1450. A terminal C between the RF circuit 1410 and the RF input pad 1440 is connected to both of the first n-stage stacked LC tank block 1460SLCP and a second n-stage stacked LC tank block 1460SLCN.

Figure 15:
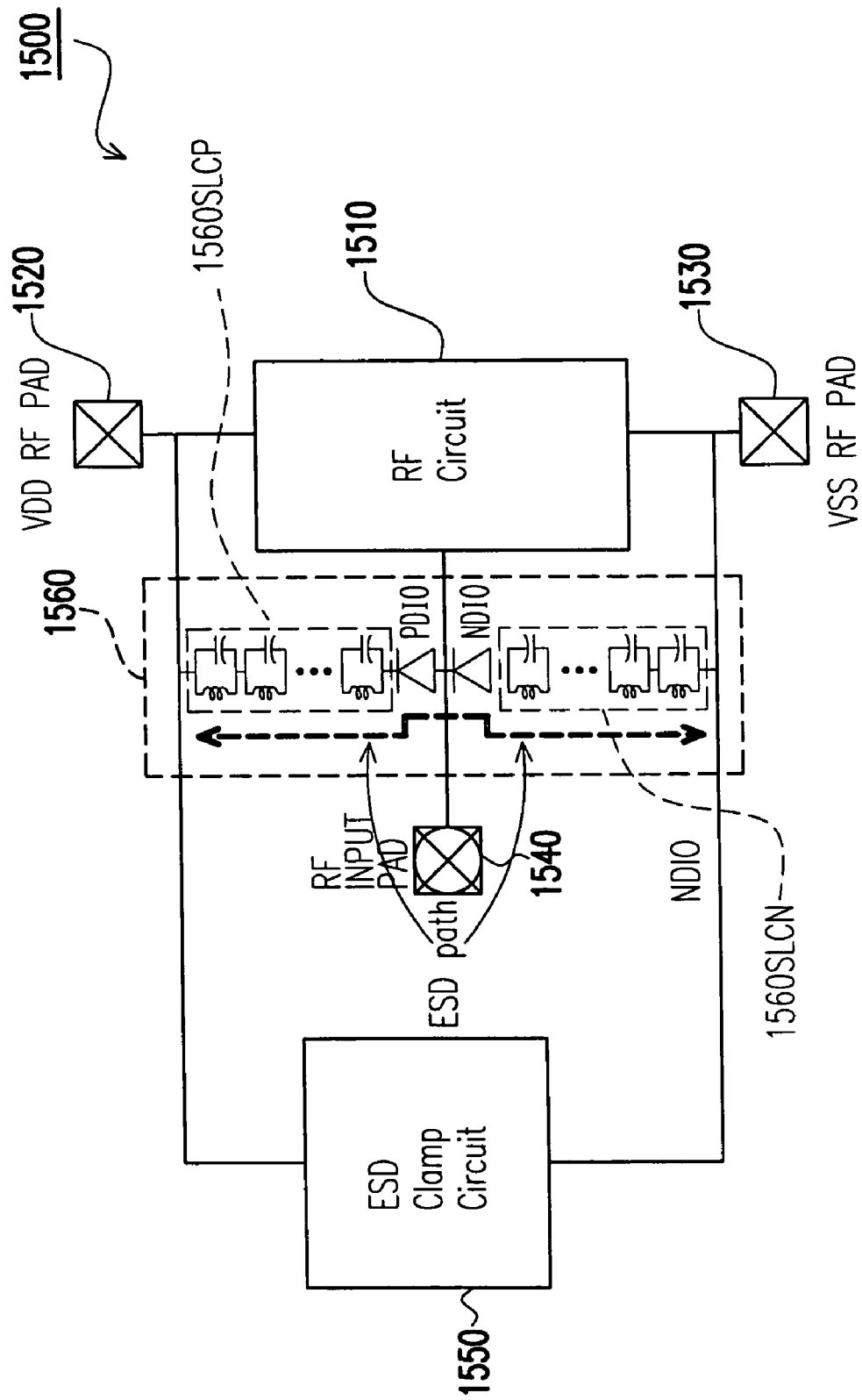

In further embodiment as shown in FIG. 15, a LC tank structure with n-stages LC tanks stacked in series is provided to achieve higher impedance at resonation. In the alternative design, compared with elements in the FIG. 14, positions of the first n-stage stacked LC tank block 1560SLCP and the PDIO diode are switched, and positions of the second n-stage stacked LC tank block 1560SLCN and the NDIO diode are also switched. As shown in FIG. 15, which depicts a RF circuit device 1500 with an ESD circuit stacked with a LC tank structure 1560, which considers the parasitic effect of inductors and capacitors implemented on the chip. The RF circuit device 1500 includes a RF circuit 1510 with a VDD voltage RF pad 1520, a VSS RF pad 1530 and a RF input pad 1540 is provided in FIG. 15. Between the RF circuit 1510 and the RF input pad 1540 is the ESD circuit. The ESD circuit includes a $V_{DD}$-to-$V_{SS}$ power clamp circuit 1550 and a LC tank structure 1560. The LC tank structure 1560 includes a first n-stage stacked LC tank block 1560SLCP and a second n-stage stacked LC tank block 1560SLCN connected in series. Each of the stacked LC tank blocks includes at least two LC tanks stacked in series together.

ESD Devices with Stacked LC Tank and Diode (ESD Block) Structures

Figure 16:
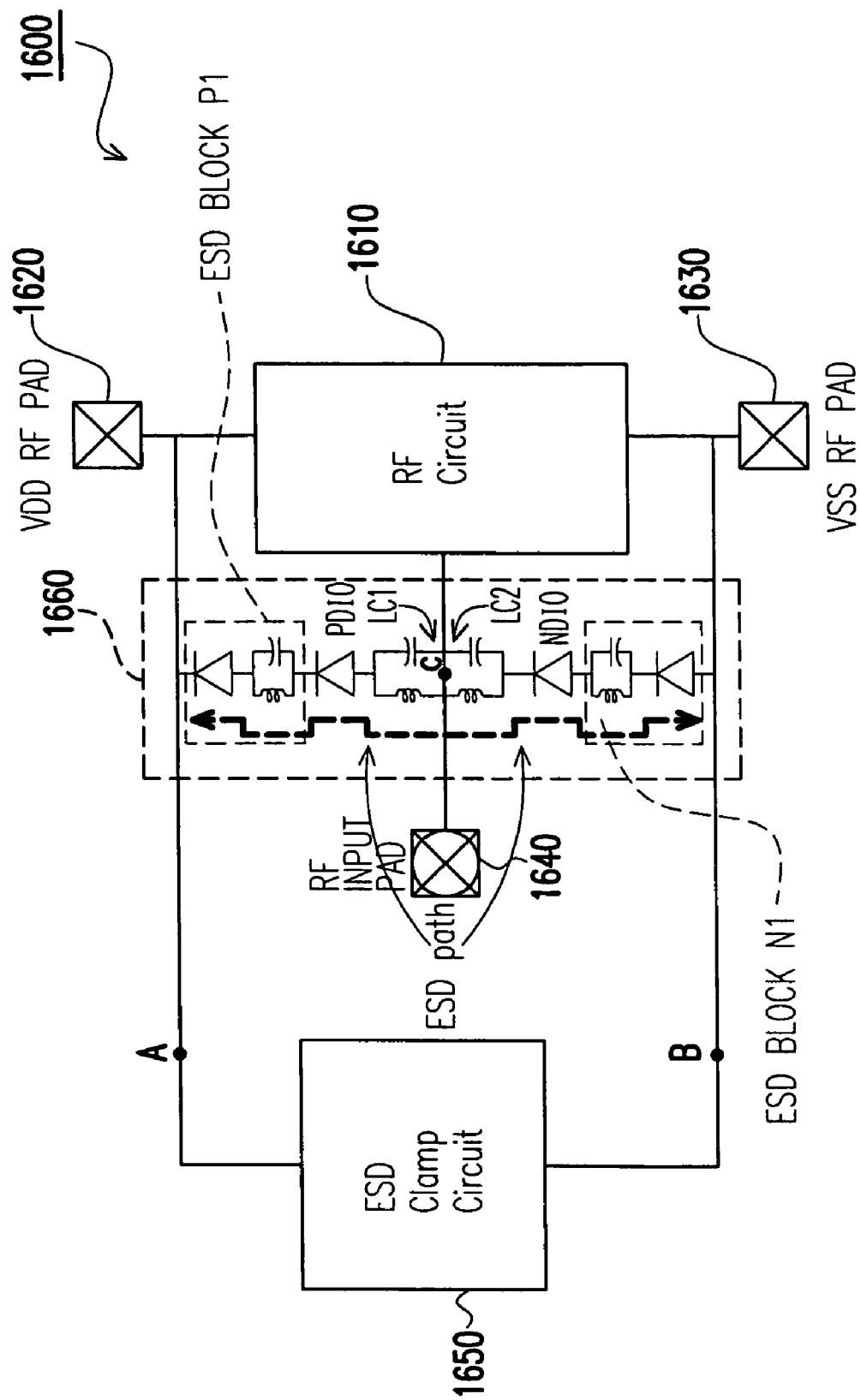

Applying the same principle of the incorporation of LC tanks into a ESD protection device and the fact that stacked ESD devices decreases the parasitic capacitance, it is provided in an alternative embodiment to create designs of ESD protection devices by stacking similar ESD blocks (ESD BLOCK P1 and ESD BLOCK N1 as shown in FIG. 16), herein is denoted as a "stacked ESD block structure". Using these designs, the power gain loss is reduced by stacked LC tanks and the power gain loss affected by the stacked ESD diodes is also decreased. This significantly lowers the total power gain loss by the introduction of ESD circuits into RF circuits.

FIG. 16 depicts the ESD circuit stacked with a stacked ESD block structure 1660. The RF circuit device 1600 includes a RF circuit 1610 with a VDD voltage RF pad 1620, a VSS RF pad 1630 and a RF input pad 1640 is provided in FIG. 16. Between the RF circuit 1610 and the RF input pad 1640 is the ESD circuit coupled therebetween. The ESD circuit includes a $V_{DD}$-to-$V_{SS}$ power clamp circuit 1650 and a stacked ESD block structure 1660. The stacked ESD block structure 1660 includes two portions between the ESD clamp circuit 1650 and a terminal C located between the RF circuit 1610 and the RF input pad 1640.

In the first portion, the first ESD block ESD BLOCK P1, a LC tank LC1 and an ESD diode PDIO are connected in series. One terminal of the first ESD block ESD BLOCK P1 is connected to a first terminal A of the ESD clamp circuit 1650 and another terminal of the first ESD block ESD BLOCK P1 is connected to an cathode terminal of the diode PDIO. A anode terminal of the diode PDIO is connected to the LC tank LC1. The other terminal of the LC tank LC1 opposite to the terminal connected to the diode PDIO is connected to terminal C. In the second portion, the second ESD block ESD BLOCK N1, a LC tank LC2 and an ESD diode NDIO are connected in series. One terminal of the second ESD block ESD BLOCK N1 is connected to a second terminal B of the ESD clamp circuit 1650 and another terminal of the second ESD block ESD BLOCK N1 is connected to a anode terminal of the diode NDIO. An cathode terminal of the diode NDIO is connected to the LC tank LC2. The other terminal of the LC tank LC2 opposite to the terminal connected to the diode NDIO is connected to the terminal C.

To avoid the diodes from operating under breakdown condition during the PS-mode and ND-mode ESD stresses, which results in a lowered ESD protection level, a turn-on efficient $V_{DD}$-to-$V_{SS}$ ESD clamp circuit 1650, between the power rails, is constructed into the ESD protection circuit. This $V_{DD}$-to-$V_{SS}$ ESD clamp circuit can significantly increase the overall ESD protection while lowering the power gain loss of the RF circuit.

When the RF INPUT pin is zapped with one of the four ESD stress modes, the NDIO or PDIO diode operates under forward-biased condition with the inductor to discharge the ESD current. Diodes operating under forward-biased condition can sustain a much higher ESD level than those operating under reverse-biased breakdown condition. The $V_{DD}$-to-$V_{SS}$ ESD clamp circuit 1650 is turned on when the RF INPUT PAD 1640 is zapped with PS-mode or ND-mode ESD stresses. The ESD current is bypassed through the forward-biased PDIO diode and the turned-on $V_{DD}$-to-$V_{SS}$ ESD clamp circuit 1650 between the $V_{DD}/V_{SS}$ power rails, because the NDIO diode, in PS-mode ESD stress, does not operate under breakdown condition. Similarly, the NDIO diode and inductor operates under forward-biased condition with the $V_{DD}$-to-$V_{SS}$ ESD clamp circuit 1650, between the $V_{DD}/V_{SS}$ power rails, to safely discharge ND-mode ESD current. The $V_{DD}$-to-$V_{SS}$ ESD clamp circuit 1650 is especially designed with a larger device dimension to sustain a high-level ESD. Although the large-dimension $V_{DD}$-to-$V_{SS}$ ESD clamp circuit 1650 has a large junction capacitance, this capacitance does not contribute to the RF INPUT PAD 1640. By applying this ESD protection design, the RF INPUT pin can sustain much higher levels of ESD in the four ESD stress modes (FIG. 2). Therefore, the loading capacitance generated from the PDIO and NDIO of ESD protection devices to the RF INPUT PAD 100 can be significantly avoided by the insertion of the LC tank. Hence, there will be no significant degradation of performance in RF IC.

Figure 17:
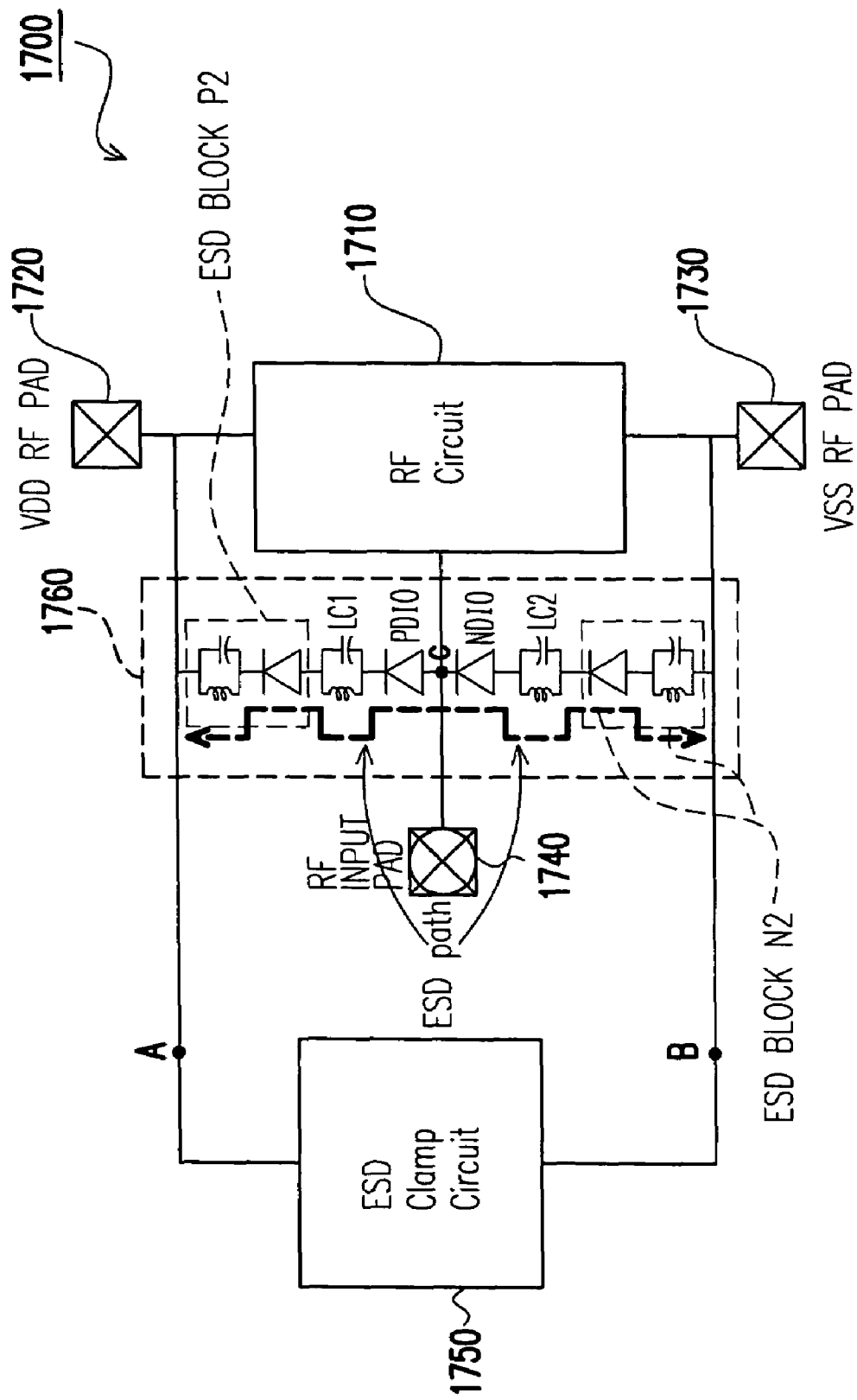

FIG. 17 shows an alternative design to the said circuit by stacking ESD BLOCKs with the LC tanks and the diodes switched (ESD BLOCK P2 and ESD BLOCK N2). FIG. 17 depicts the ESD circuit stacked with a stacked ESD block structure 1760. The RF circuit device 1700 includes a RF circuit 1710 with a VDD voltage RF pad 1720, a VSS RF pad 1730 and a RF input pad 1740 is provided in FIG. 17. Between the RF circuit 1710 and the RF input pad 1740 is the ESD circuit coupled therebetween. The ESD circuit includes a $V_{DD}$-to-$V_{SS}$ power clamp circuit 1750 and a stacked ESD block structure 1760. The stacked ESD block structure 1760 includes two portions. In the first portion, a first ESD block ESD BLOCK P2, a LC tank LC1 and an ESD diode PDIO are connected in series. In the second portion, a second ESD block ESD BLOCK N2, a LC tank LC2 and an ESD diode NDIO are connected in series. Each of the ESD block includes at least a LC tank and an ESD diode stacked in series together. In the alternative design, compared with elements in the FIG. 16, positions of the first ESD block ESD BLOCK P2 and the PDIO diode are switched, and positions of the second ESD block ESD BLOCK N2 and the NDIO diode are also switched.

To avoid the diodes from operating under breakdown condition during the PS-mode and ND-mode ESD stresses, which results in a lower ESD protection level, a turn-on efficient $V_{DD}$-to-$V_{SS}$ ESD clamp circuit 1750, between the power rails, is constructed into the ESD protection circuit. This significantly increases the overall ESD protection while lowering the power gain loss of the RF circuits.

The ESD circuit with LC tank above-mentioned is constructed of two parts. First is the implementation of ESD device in the I/O port. The other is the LC tank. Regarding the ESD device, due to the minimization requirement of parasitic capacitance in RF IC, ESD devices used in this invention must possess high ESD level with small layout area. Regarding the LC tank, the inductor can be implemented on board the chip. In CMOS technology, on-chip inductors with a low Q value could cause degradation to the realistic LC resonating condition. However, there exist alternative high Q value inductors and bond-wire inductors that will limit such degradations. The capacitors used in the invention can be metal-in-metal or MOS capacitors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) circuit, adaptive to a radio frequency (RF) device, which includes a RF circuit with a VDD voltage RF pad, a VSS RF pad and a RF input pad, the ESD circuit comprising:

a ESD clamp circuit including two terminals, the first one of which is connected to the VDD voltage RF pad, and the second one of which is connected to the VSS RF pad; and a LC tank structure, coupled between the two terminals of the ESD clamp circuit, and between the RF circuit and the RF input pad, wherein the LC tank structure includes a first ESD block between the first terminal of the ESD clamp circuit and the RF input pad, and a second ESD block between the second terminal of the ESD clamp circuit and the RF input pad.

2. The ESD circuit of claim 1, wherein the first ESD block includes a first diode and two first LC tanks connected in series, and the second ESD block includes a second diode and two second LC tanks.

3. The ESD circuit of claim 2, wherein an cathode terminal of the first diode is coupled to the first terminal of the ESD clamp circuit and a anode terminal of the first diode is coupled to the one of the first LC tanks, and an cathode terminal of the second diode is coupled to one of the second LC tanks and a anode terminal of the second diode is coupled to the second terminal of the ESD clamp circuit.

4. The ESD circuit of claim 3, wherein each of the first and second LC tanks includes an inductor and a capacitor connected to each other in parallel.

5. The ESD circuit of claim 2, wherein a cathode terminal of the first diode is coupled to one of the first LC tanks and an anode terminal of the first diode is coupled to a terminal between the RF circuit and the RF input pad, and a cathode terminal of the second diode is coupled to the terminal between the RF circuit and the RF input pad and an anode terminal of the second diode is coupled to the one of the second LC tanks.

6. The ESD circuit of claim 5, wherein each of the first and second LC tanks includes an inductor and a capacitor connected to each other in parallel.

7. The ESD circuit of claim 1, wherein the first ESD block includes a first diode and a plurality of first LC tanks connected in series, and the second ESD block includes a second diode and a plurality of second LC tanks.

8. The ESD circuit of claim 7, wherein an cathode terminal of the first diode is coupled to the first terminal of the ESD clamp circuit and a anode terminal of the first diode is coupled to the one of the first LC tanks, and an cathode terminal of the second diode is coupled to one of the second LC tanks and a anode terminal of the second diode is coupled to the second terminal of the ESD clamp circuit.

9. The ESD circuit of claim 8, wherein each of the first and second LC tanks includes an inductor and a capacitor connected to each other in parallel.

10. The ESD circuit of claim 1, wherein an cathode terminal of the first diode is coupled to one of the first LC tanks and a anode terminal of the first diode is coupled to a terminal between the RF circuit and the RF input pad, and an cathode terminal of the second diode is coupled to the terminal between the RF circuit and the RF input pad and a anode terminal of the second diode is coupled to the one of the second LC tanks.

11. The ESD circuit of claim 10, wherein each of the first and second LC tanks includes an inductor and a capacitor connected to each other in parallel.

* * * * *